(12) United States Patent
Lu

(10) Patent No.: US 10,998,251 B2
(45) Date of Patent: May 4, 2021

(54) SEMICONDUCTOR PACKAGE STRUCTURE AND A METHOD OF MANUFACTURING THE SAME

(71) Applicant: Advanced Semiconductor Engineering, Inc., Kaohsiung (TW)

(72) Inventor: Wen-Long Lu, Kaohsiung (TW)

(73) Assignee: ADVANCED SEMICONDUCTOR ENGINEERING, INC., Kaohsiung (TW)

(*) Notice: Subject to any disclaimer, the term of this patent is extended or adjusted under 35 U.S.C. 154(b) by 24 days.

(21) Appl. No.: 16/244,991

(22) Filed: Jan. 10, 2019

(65) Prior Publication Data

US 2020/0227340 A1   Jul. 16, 2020

(51) Int. Cl.
| | |
|---|---|
| *H01L 23/42* | (2006.01) |
| *H01L 23/00* | (2006.01) |
| *H01L 21/56* | (2006.01) |
| *H01L 23/31* | (2006.01) |
| *H01L 23/522* | (2006.01) |
| *H01L 23/528* | (2006.01) |

(52) U.S. Cl.
CPC ............ *H01L 23/42* (2013.01); *H01L 21/563* (2013.01); *H01L 23/3128* (2013.01); *H01L 23/5226* (2013.01); *H01L 23/5283* (2013.01); *H01L 24/09* (2013.01); *H01L 24/17* (2013.01); *H01L 24/49* (2013.01); *H01L 24/73* (2013.01)

(58) Field of Classification Search
CPC . H01L 23/473; H01L 23/0521; H01L 23/052; H01L 23/42; H01L 23/5226; H01L 23/5283; H01L 24/73; H01L 23/3128; H01L 24/49; H01L 24/09; H01L 24/17; H01L 21/563; H01L 2221/68345; H01L 21/6835; H01L 21/4857; H01L 23/49816; H01L 23/49822; H01L 23/145
See application file for complete search history.

(56) References Cited

U.S. PATENT DOCUMENTS

| | | | |
|---|---|---|---|
| 7,215,547 B2 | 5/2007 | Chang et al. | |
| 7,679,916 B2 | 3/2010 | Orr et al. | |
| 8,937,390 B2 | 1/2015 | Hisano et al. | |
| 2002/0185718 A1 | 12/2002 | Mikubo et al. | |
| 2020/0176355 A1* | 6/2020 | May .................. | H01L 23/49827 |

* cited by examiner

*Primary Examiner* — Jasmine J Clark
(74) *Attorney, Agent, or Firm* — Foley & Lardner LLP

(57) ABSTRACT

A semiconductor trace structure is provided for carrying a heat source. The semiconductor device package includes a dielectric structure having a first surface configured to receive the heat source and a second surface opposite to the first surface; a cavity defined by the dielectric structure to accommodate a fluid. The cavity includes a first passage portion between the first surface and the second surface. A first area of the first passage portion is closer to the heat source than a second area of the first passage portion, and that the first area is greater than the second area from a top view perspective. A method for manufacturing the semiconductor trace structure is also provided.

20 Claims, 47 Drawing Sheets

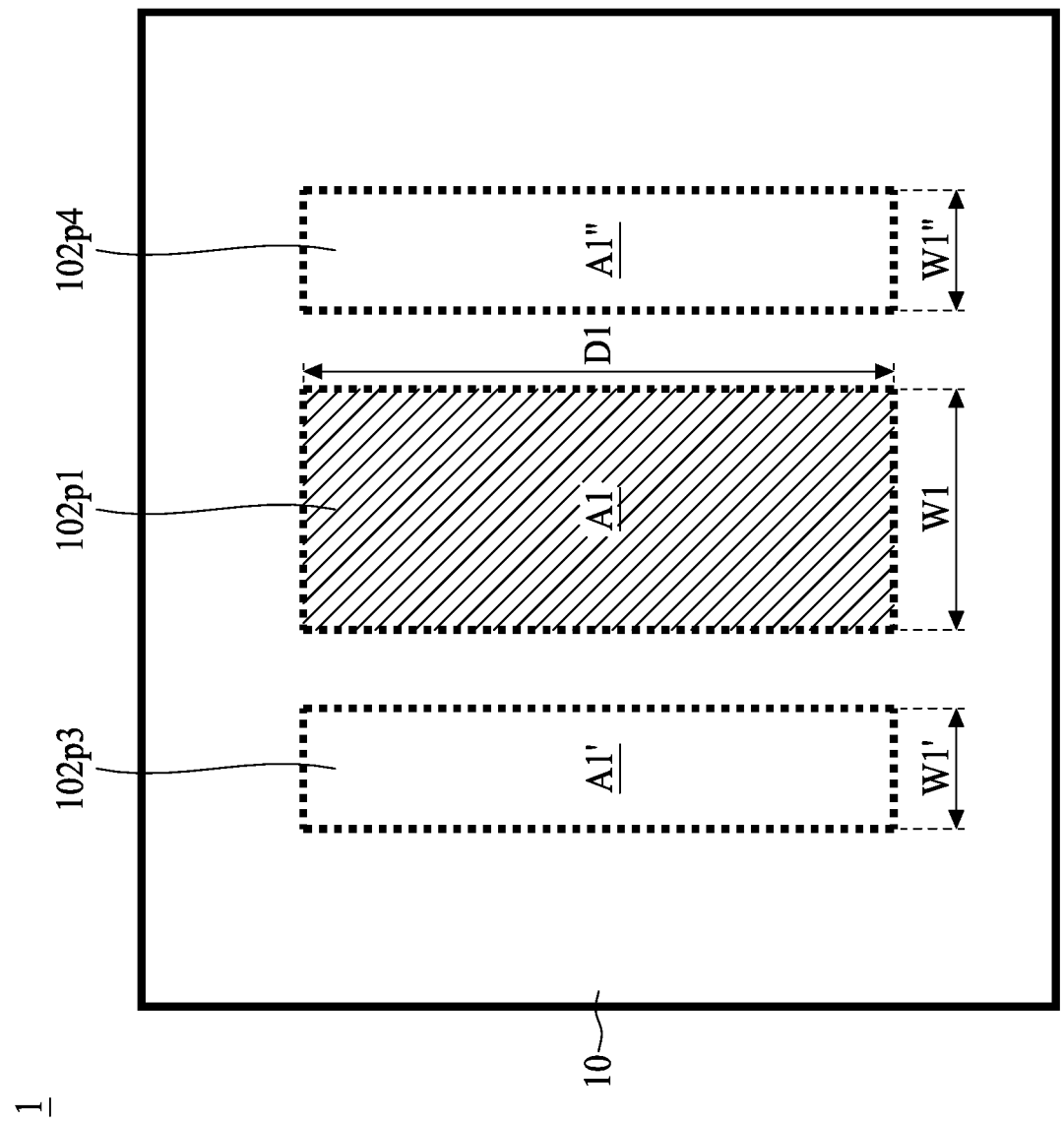

SEMICONDUCTOR PACKAGE STRUCTURE AND A METHOD OF MANUFACTURING THE SAME

BACKGROUND

1. Technical Field

The present disclosure relates to a semiconductor package structure comprising a cavity defined by a dielectric structure and a fluid filling the cavity for heat dissipation.

2. Description of the Related Art

Semiconductor packages demand improved design with greater heat dissipation. When packaged with a semiconductor die or chip, a heat-affected zone (approximately under the projection area of the semiconductor die or chip) and a non-heat-affected zone (away from the projection area of the semiconductor die or chip) are induced in the corresponding semiconductor substrate, causing warpage of the semiconductor substrate. Warpage phenomenon leads to cracking between micro-bump and micro-pad joining the semiconductor die or chip and the semiconductor substrate.

A comparative approach includes attaching heat sinks (heat-dissipation fin, heat spreader, or heat-conducting plate) on molding compounds; embedding heat-conducting structures in the substrate, or utilizing molding compounds having high thermal conductivity, to enhance heat dissipation of the semiconductor packages.

However, heat conduction, which is adopted by the comparative approach, is not the best solution for enhancing heat dissipation in the semiconductor package due to the fact that the molding compound or the dielectric layer encapsulating/forming the semiconductor substrate possesses low thermal conductivity.

SUMMARY

Embodiments of this disclosure provide a semiconductor trace structure and a semiconductor package structure utilizing heat convection, instead of heat conduction, to dissipate the heat generated by a heat source. A cavity for fluid accommodation is formed in a semiconductor trace structure and approximately positioned under the projection of the heat source. The cavity includes a first guidance portion close to the heat source, a second guidance portion distal from the heat source, and a plurality of passage portions connecting the first guidance portion and the second guidance portion. At least one of the passage zones has a taper profile which is wider at the end close to the first guidance portion and narrower at the end close to the second guidance portion. According to ideal fluid equation, PV=nRT, pressure of the fluid in each portion is positively correlated to the temperature of the fluid in said corresponding portion. The cavity is so designed to drive the fluid flowing from the first guidance portion (with higher T and P) through the passage portions having the tapered profile and reach the second guidance portion (with lower T and P), subsequently, the pressure caused by temperature difference continues to drive the fluid from the second guidance portion back to the first guidance portion through other passage portions and thereby completing a circulation cycle for heat dissipation.

In some embodiments, according to one aspect, a semiconductor package structure for carrying a heat source includes a dielectric structure having a first surface configured to receive the heat source and a second surface opposite to the first surface; and a cavity defined by the dielectric structure to accommodate a fluid, wherein the cavity includes a first passage portion between the first surface and the second surface, a first area of the first passage portion being closer to the heat source than a second area of the first passage portion, the first area being greater than the second area from a top view perspective.

In some embodiments, according to one aspect, a semiconductor package structure includes a dielectric structure having a first surface and a second surface opposite to the first surface; a cavity defined by the dielectric structure to accommodate a fluid; a heat source at the first surface of the dielectric structure; wherein the cavity includes a first passage portion having a first principal dimension, from a cross sectional perspective, between the first surface and the second surface, and the first passage portion is under a projection of the heat source.

In some embodiments, according to another aspect, a method is disclosed for manufacturing a semiconductor package structure. The method includes: providing a first dielectric structure having a first surface and a second surface opposite to the first surface, the first dielectric structure having a thermal enhanced generator (TEG) region and a substrate region, the TEG region being configured to receive a heat source; forming a first sacrificial layer over the first surface of the first dielectric structure; patterning the first sacrificial layer to expose the substrate region; forming a second dielectric structure over the first sacrificial layer being patterned and the substrate region being exposed; and removing the first sacrificial layer.

BRIEF DESCRIPTION OF THE DRAWINGS

FIG. 1B illustrates a first top view of the semiconductor trace structure across line A-A in FIG. 1A according to some embodiments of the present disclosure.

DETAILED DESCRIPTION

Figure 1A:
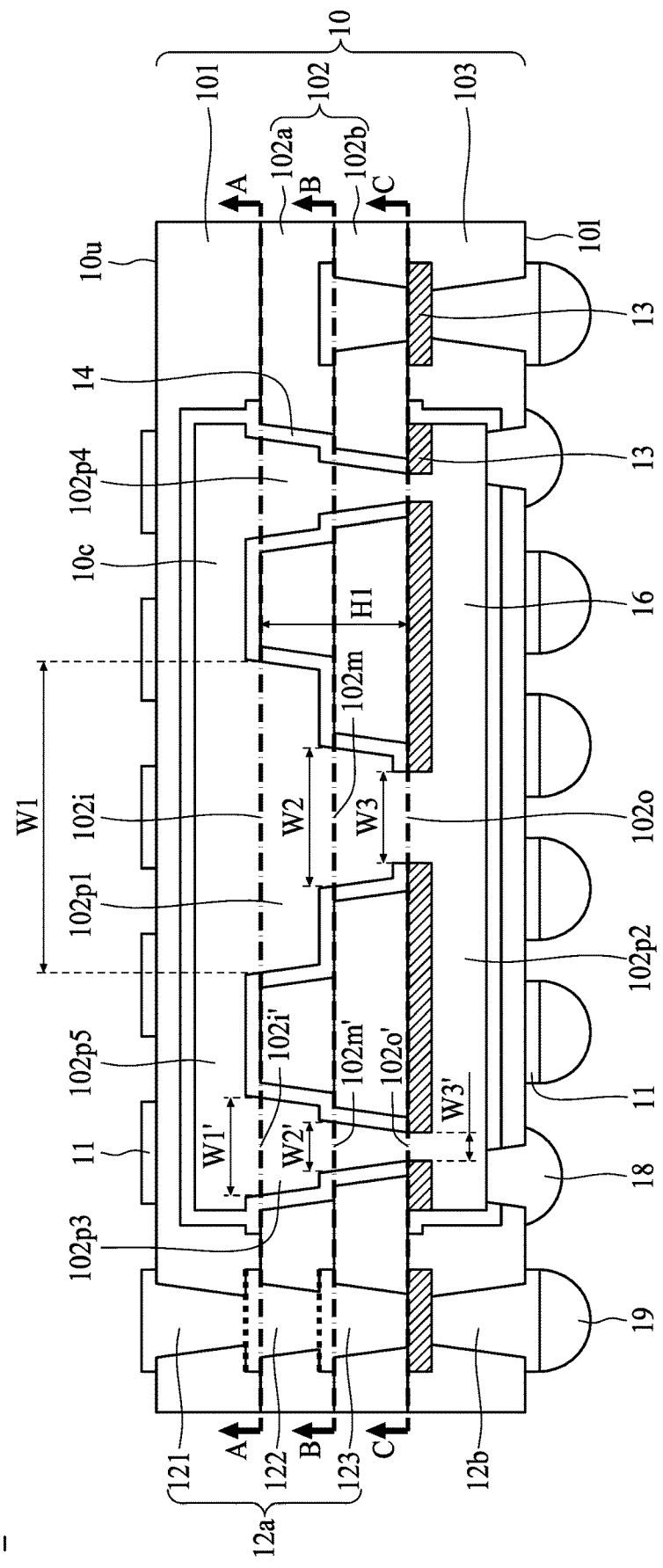
FIG. 1A illustrates a cross-sectional view of a semiconductor trace structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

Spatial descriptions, such as "above," "below," "up," "left," "right," "down," "top," "bottom," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

FIG. 1A is a cross-sectional view of a semiconductor trace structure 1 in accordance with some embodiments of the present disclosure. The semiconductor trace structure 1 includes a dielectric structure 10, a cavity 10C, a conductive pad 11, an interconnection conductive structure 12a, an interconnection conductive structure 12b, a patterned conductive layer 13, a conductive layer 14, a sealing element 18, and a connection element 19. The semiconductor trace structure 1 may be a substrate or a bumping structure. In some embodiments, the cavity 10C defined by the dielectric structure 10 may accommodate a fluid 16. The fluid 16 may completely fill or partially fill the cavity 10C. In some embodiments, the semiconductor trace structure 1 includes a cavity 10C without being filled or partially filled by the fluid 16.

The dielectric structure 10 has an upper surface 10u and a lower surface 101. The upper surface 10u is opposite to the lower surface 101. The dielectric structure 10 may be a multi-layer structure. The dielectric structure 10 includes a dielectric layer 101, a dielectric layer 102, and a dielectric layer 103. The dielectric layer 102 includes a dielectric layer 102a and a dielectric layer 102b. The dielectric layers 101, 102a, 102b, or 103 may include an organic layer, such as a solder mask, polyimide (PI), epoxy, an Ajinomoto build-up film (ABF), a polypropylene (PP), or a molding compound. The dielectric layers 101, 102a, 102b, or 103 may include an inorganic layer, such as oxide or nitride materials ($SiO_x$, $SiN_x$, $TaO_x$), silicon (Si), glass, or ceramic. The dielectric layers 101, 102a, 102b, and 103 may be the same or different from one another. The dielectric layer 101, 102a, 102b, or 103 may include fiber cloth. The dielectric layer 101, 102a, 102b, or 103 may include molding compounds.

The conductive pad 11 is disposed on the upper surface 10u of the dielectric structure 10. The conductive pad 11 is disposed on the lower surface 101 of the dielectric structure 10. The conductive pad 11 disposed on the lower surface 101 of the dielectric structure 10 is electrically connected to the connection element 19. In some embodiments, the connection element 19 may be omitted. The conductive pad 11 may be a bonding pad. The conductive pad 11 may be designed as a fan-out bonding pad. The conductive pad 11 may be designed as a fan-in bonding pad. The connection element 19 may be designed as a fan-out soldering pad. The connection element 19 may be designed as a fan-in soldering pad.

In some embodiments, a protection layer may be disposed on the upper surface 10u of the dielectric structure 10. The protection layer may be disposed on the lower surface 101 of the dielectric structure 10. The protection layer covers the conductive pad 11. The protection layer may be a solder resist layer. In some embodiments, the protection layer may be omitted.

The patterned conductive layer 13 is disposed on a lower surface of the dielectric layer 102b. A portion of the patterned conductive layer 13 is embedded in the dielectric layer 103. The interconnection conductive structure 12a extends from the patterned conductive layer 13 to the upper surface 10u. The interconnection conductive structure 12b extends from the patterned conductive layer 13 to the lower surface 101. The interconnection conductive structure 12a includes an interconnection conductive structure 121, an interconnection conductive structure 122, and an interconnection conductive structure 123. The interconnection conductive structure 121 includes an internal portion embedded in the dielectric layer 101. The interconnection conductive structure 121 includes an external portion on the dielectric layer 101. The interconnection conductive structure 12b includes an internal portion embedded in the dielectric layer 103. The interconnection conductive structure 12b includes an external portion on the dielectric layer 103.

The cavity 10C is defined by the dielectric structure 10. The cavity 10C formed in the dielectric structure 10 may be utilized to accommodate the fluid 16. In some embodiments, the fluid 16 may include methanol, pentane, benzene, ethyl alcohol, and refrigerant. The fluid 16 may include liquid nitrogen, liquid $NH_3$, potassium, sodium, water, or other suitable materials. The conductive layer 14 is formed on an inner wall of the cavity 10C. The conductive layer 14 surrounds the cavity 10C. The patterned conductive layer 13 and the conductive layer 14 surround the cavity 10C. The patterned conductive layer 13 and the conductive layer 14 are lined on the inner wall of the cavity 10C. The conductive layer 14 may act as a thermal-conduction layer to facilitate heat dissipation. The patterned conductive layer 13 and the conductive layer 14 isolate the fluid 16 from the dielectric structure 10 so as to prevent the dielectric structure 10 from erosion. In some embodiments, the patterned conductive layer 13 and the conductive layer 14 may be grounded.

The cavity 10C includes a passage portion 102p1 extending between the upper surface 10u and the lower surface 101 of the dielectric structure 10. The passage portion 102p1 has a principal dimension H1 from a cross sectional perspective. The cavity 10C includes a passage portion 102p3 and a passage portion 102p4 extending between the upper surface 10u and the lower surface 101 of the dielectric structure 10. The design of the passage portion 102p4 may be similar to that of the passage portion 102p3. The passage portion 102p3 and the passage portion 102p4 are parallel with the passage portion 102p1. The cavity 10C includes a guidance portion 102p2 and a guidance portion 102p5 in parallel with the guidance portion 102p2. The guidance portion 102p2 is perpendicular to the passage portion 102p1. In some embodiments, the passage portion 102p1 comprises a tapered profile or a step profile. The passage portion 102p1 comprises a multi-step profile. The passage portion 102p3 and the passage portion 102p4 comprise a tapered profile or a step profile. The passage portion 102p1 is defined by the dielectric layer 102a and the dielectric layer 102b. The passage portion 102p3 is defined by the dielectric layer 102a and the dielectric layer 102b. The passage portion 102p4 is defined by the dielectric layer 102a and the dielectric layer 102b. The guidance portion 102p2 is defined by the dielectric layer 103 and the dielectric layer 102b. The guidance portion 102p5 is defined by the dielectric layer 101 and the dielectric layer 102a.

The passage portion 102p1 includes an input portion 102i in proximity to the upper surface 10u of the dielectric structure 10, an output portion 102o in proximity to the lower surface 101 of the dielectric structure 10, and a middle portion 102m between the input portion 102i and the output portion 102o. The input portion 102i includes a width W1. The middle portion 102m includes a width W2. The output portion 102o includes a width W3. The width W1 is greater than the width W2. The width W2 is greater than the width W3.

The passage portion 102p3 includes an input portion 102i' in proximity to the upper surface 10u of the dielectric structure 10, an output portion 102o' in proximity to the lower surface 101 of the dielectric structure 10, and a middle portion 102m' between the input portion 102i' and the output portion 102o'. The input portion 102i' includes a width W1'. The middle portion 102m' includes a width W2'. The output portion 102o' includes a width W3'. The width W1' is greater than the width W2'. The width W2' is greater than the width W3'. The width W1' is less than the width W1. The width W2' is less than the width W2. The width W3' is less than the width W3.

The sealing element 18 is disposed on the lower surface 101 of the dielectric layer 103. In another embodiment, the sealing element 18 is disposed on the upper surface 10u of the dielectric layer 101. In some embodiments, the sealing element 18 may be disposed at any suitable position of the dielectric layer 101 or the dielectric layer 103. The sealing element 18 seals an opening of the cavity 10C. The patterned conductive layer 13, the conductive layer 14, and the sealing element 18 enclose the cavity 10C. The patterned conductive layer 13, the conductive layer 14, and the sealing element 18 seal the cavity 10C.

The connection element 19 may be disposed on the conductive pad 11 on the lower surface 101. The connection element 19 may be disposed on the external portion of the interconnection conductive structure 12b. The connection element 19 may be a solder ball or a pillar bump formed with solder.

FIG. 1B illustrates a first top view of the semiconductor trace structure 1 across line A-A in FIG. 1A in accordance with some embodiments of the present disclosure. The passage portion 102p1 has a principal or major dimension D1 (e.g., the length) from the first top view perspective. The passage portion 102p1 has a minor dimension W1 (e.g., the width) from the first top view perspective. The passage portion 102p1 has an area A1 enclosed by the principal or major dimension D1 and the minor dimension W1 from the first top view perspective.

The passage portion 102p3 has a principal or major dimension D1 (e.g., the length) from the first top view perspective. The passage portion 102p3 has a minor dimension W1' (e.g., the width) from the first top view perspective. The passage portion 102p3 has an area A1' enclosed by the principal or major dimension D1 and the minor dimension W1' from the first top view perspective. The passage portion 102p4 has a major dimension D1 (e.g., the length) from the first top view perspective. The passage portion 102p4 has a minor dimension W1" (e.g., the width) from the first top view perspective. The passage portion 102p4 has an area A1" enclosed by the principal or major dimension D1 and the minor dimension W1" from the first top view perspective. In some embodiments, the minor dimension W1' is substantially equal to the minor dimension W1". The area A1 is greater than either the area A1' or the area A1". In some embodiments, the minor dimension W1' may be different from the minor dimension W1". The length of the passage portion 102p3 or passage portion 102p4 may be different from that of passage portion 102p1 from the first top view perspective. The minor dimension W1 is greater than the minor dimension W1'. The minor dimension W1 is greater than the minor dimension W1". In some embodiments, the areas A1, A1', or A1" may be in a rectangular shape, a square shape, an elliptical shape, a circular shape, or an irregular shape. The shapes of areas A1, A1', and A1" may be the same or different.

Figure 1C:
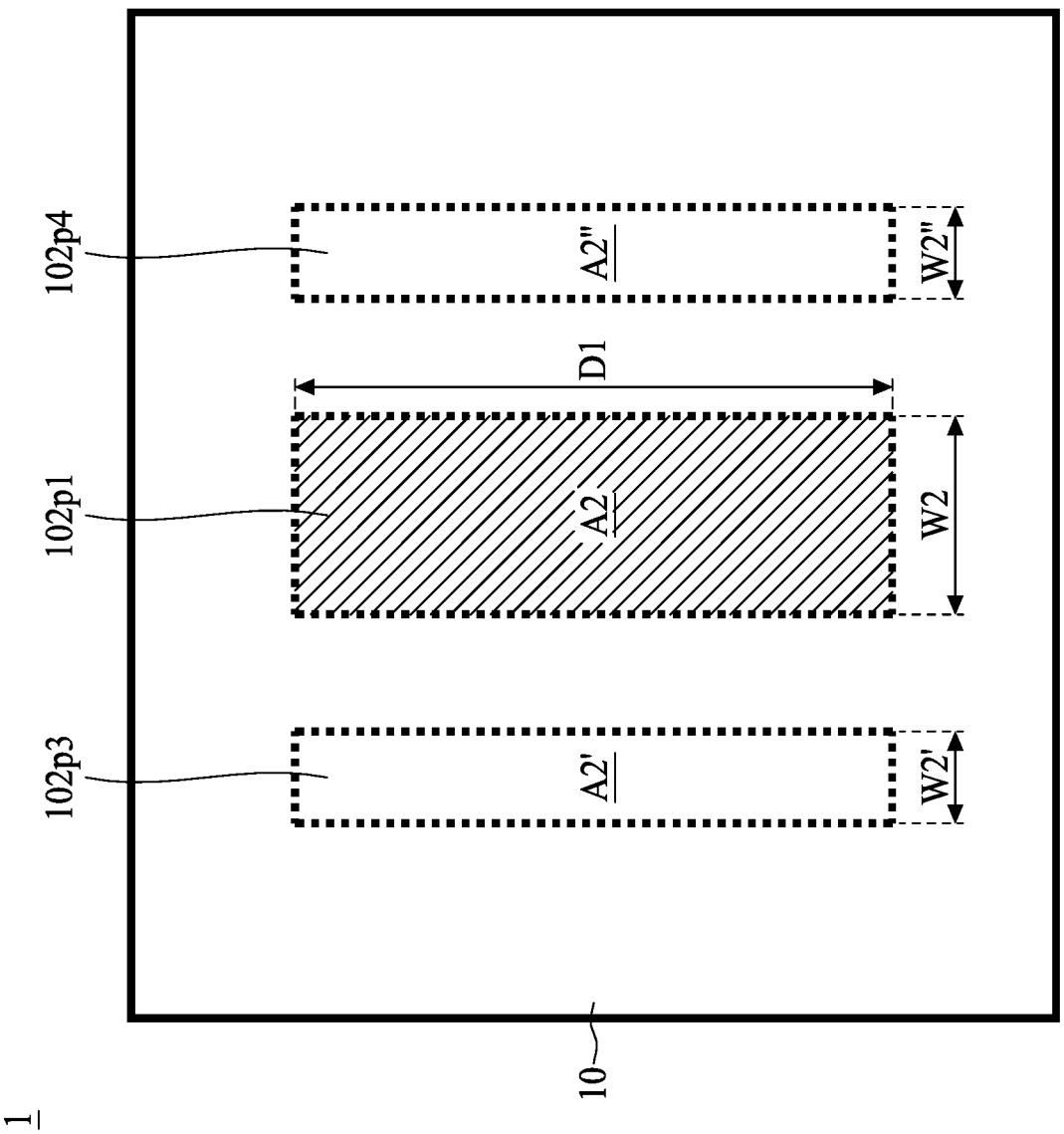
FIG. 1C illustrates a second top view of the semiconductor trace structure across line B-B in FIG. 1A according to some embodiments of the present disclosure.

FIG. 1C illustrates a second top view of the semiconductor trace structure 1 across line B-B in FIG. 1A in accordance with some embodiments of the present disclosure. The passage portion 102p1 has a principal or major dimension D1 (e.g., the length) from the second top view perspective. The passage portion 102p1 has a minor dimension W2 (e.g., the width) from the second top view perspective. The passage portion 102p1 has an area A2 enclosed by the principal or major dimension D1 and the minor dimension W2 from the second top view perspective.

The passage portion 102*p*3 has a principal or major dimension D1 (e.g., the length) from the second top view perspective. The passage portion 102*p*3 has a minor dimension W2' (e.g., the width) from the second top view perspective. The passage portion 102*p*3 has an area A2' enclosed by the principal or major dimension D1 and the minor dimension W2' from the second top view perspective. The passage portion 102*p*4 has a principal or major dimension D1 (e.g., the length) from the second top view perspective. The passage portion 102*p*4 has a minor dimension W2" (e.g., the width) from the second top view perspective. The passage portion 102*p*4 has an area A2' enclosed by the principal or major dimension D1 and the minor dimension W2" from the second top view perspective. In some embodiments, the minor dimension W2' is equal to the minor dimension W2". The area A2 is greater than the area A2'. In some embodiments, the minor dimension W2' may be different from the minor dimension W2". The length of the passage portion 102*p*3 or passage portion 102*p*4 may be different from that of passage portion 102*p*1 from the second top view perspective. The minor dimension W2 is greater than the minor dimension W2'. The minor dimension W2 is greater than the minor dimension W2". In some embodiments, the areas A2, A2', or A2" may be in a rectangular shape, a square shape, an elliptical shape, a circular shape, or an irregular shape. The shapes of areas A2, A2', and A2" may be the same or different.

Figure 1D:
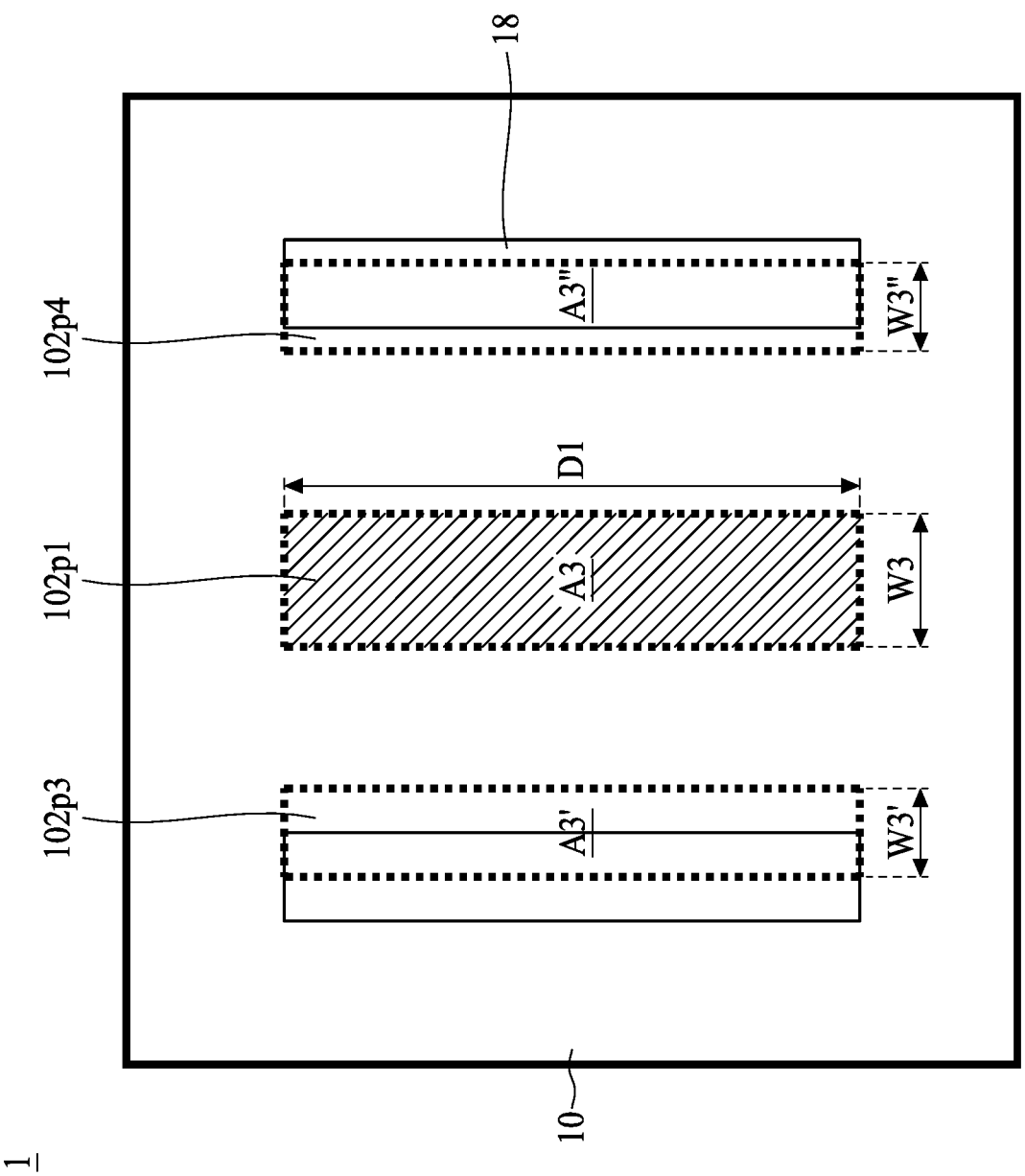
FIG. 1D illustrates a bottom view of the semiconductor trace structure across line C-C in FIG. 1A according to some embodiments of the present disclosure.

FIG. 1D illustrates a bottom view of the semiconductor trace structure 1 across line C-C in FIG. 1A in accordance with some embodiments of the present disclosure. The passage portion 102*p*1 has a principal or major dimension D1 (e.g., the length) from the bottom view perspective. The passage portion 102*p*1 has a minor dimension W3 (e.g., the width) from the bottom view perspective. The passage portion 102*p*1 has an area A3 enclosed by the principal or major dimension D1 and the minor dimension W3 from the bottom view perspective. Referring back to FIG. 1B, FIG. 1C, and FIG. 1D, the area A1 is greater than the area A2, and the area A2 is greater than the area A3.

The passage portion 102*p*3 has a principal or major dimension D1 (e.g., the length) from the bottom view perspective. The passage portion 102*p*3 has a minor dimension W3' (e.g., the width) from the bottom view perspective. The passage portion 102*p*3 has an area A3' enclosed by the principal or major dimension D1 and the minor dimension W3' from the bottom view perspective. The passage portion 102*p*4 has a principal or major dimension D1 (e.g., the length) from the bottom view perspective. The passage portion 102*p*4 has a minor dimension W3" (e.g., the width) from the bottom view perspective. The passage portion 102*p*4 has an area A3" enclosed by the principal or major dimension D1 and the minor dimension W3" from the bottom view perspective. In some embodiments, the minor dimension W3' is substantially equal to the minor dimension W3". The area A3 is greater than the area A3'. In some embodiments, the minor dimension W3' may be different from the minor dimension W3". The length of the passage portion 102*p*3 or passage portion 102*p*4 may be different from that of passage portion 102*p*1 from the bottom view perspective. The minor dimension W3 is greater than the minor dimension W3'. The minor dimension W3 is greater than the minor dimension W3". In some embodiments, the areas A3, A3', or A3" may be in a rectangular shape, a square shape, an elliptical shape, a circular shape, or an irregular shape. The shapes of areas A3, A3', and A3" may be the same or different.

Figure 1E:
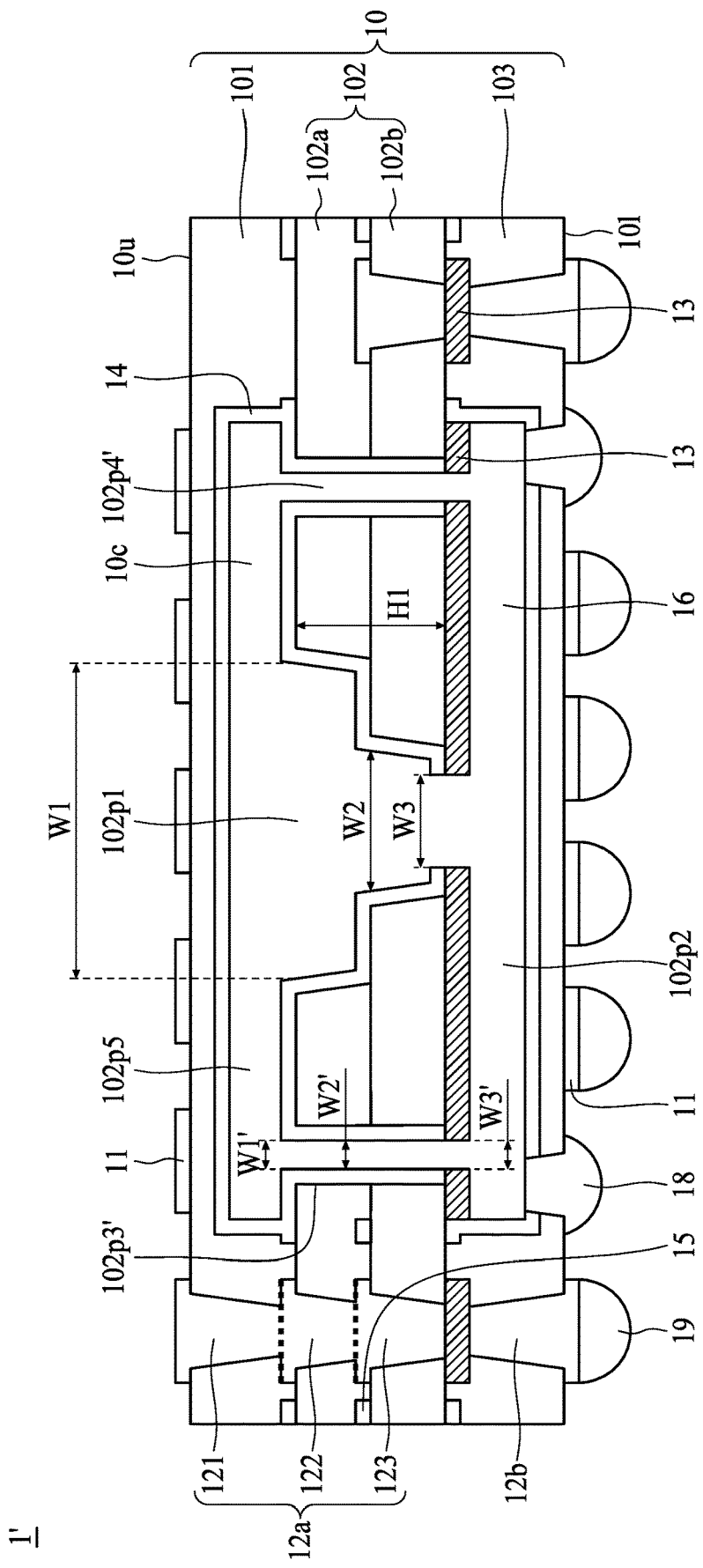
FIG. 1E illustrates a cross-sectional view of a semiconductor trace structure according to some embodiments of the present disclosure.

FIG. 1E is a cross-sectional view of a semiconductor trace structure 1' according to some embodiments of the present disclosure. The structure of FIG. 1E is similar to the structure of FIG. 1A except that the passage portion 102*p*3' and the passage portion 102*p*4' comprise a substantially vertical profile.

A conductive trace 15 is embedded in the dielectric structure 10. In some embodiments, the conductive trace 15 may be disposed between the dielectric layer 101 and the dielectric layer 102*a*. The conductive trace 15 may be disposed between the dielectric layer 102*a* and the dielectric layer 102*b*. The conductive trace 15 may be disposed between the dielectric layer 102*b* and the dielectric layer 103. The conductive trace 15 may be electrically connected to the conductive layer 13, the conductive layer 14, or both.

Figure 1F:
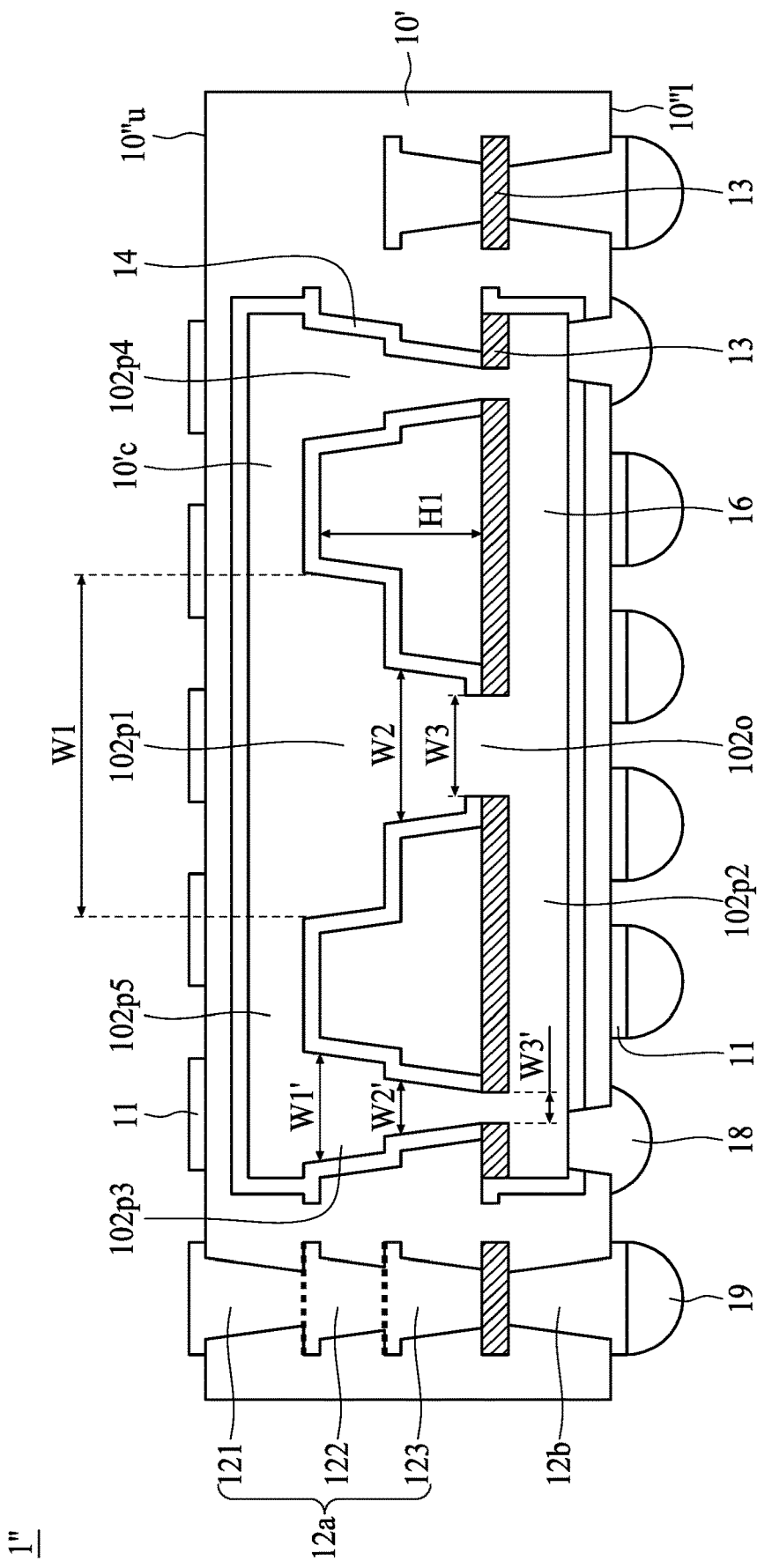
FIG. 1F illustrates a cross-sectional view of a semiconductor trace structure according to some embodiments of the present disclosure.

FIG. 1F is a cross-sectional view of a semiconductor trace structure 1" according to some embodiments of the present disclosure. The structure of FIG. 1F is similar to the structure of FIG. 1A except that a dielectric structure 10' is a molding compound. The dielectric structure 10' may be integrally formed.

Figure 1G:
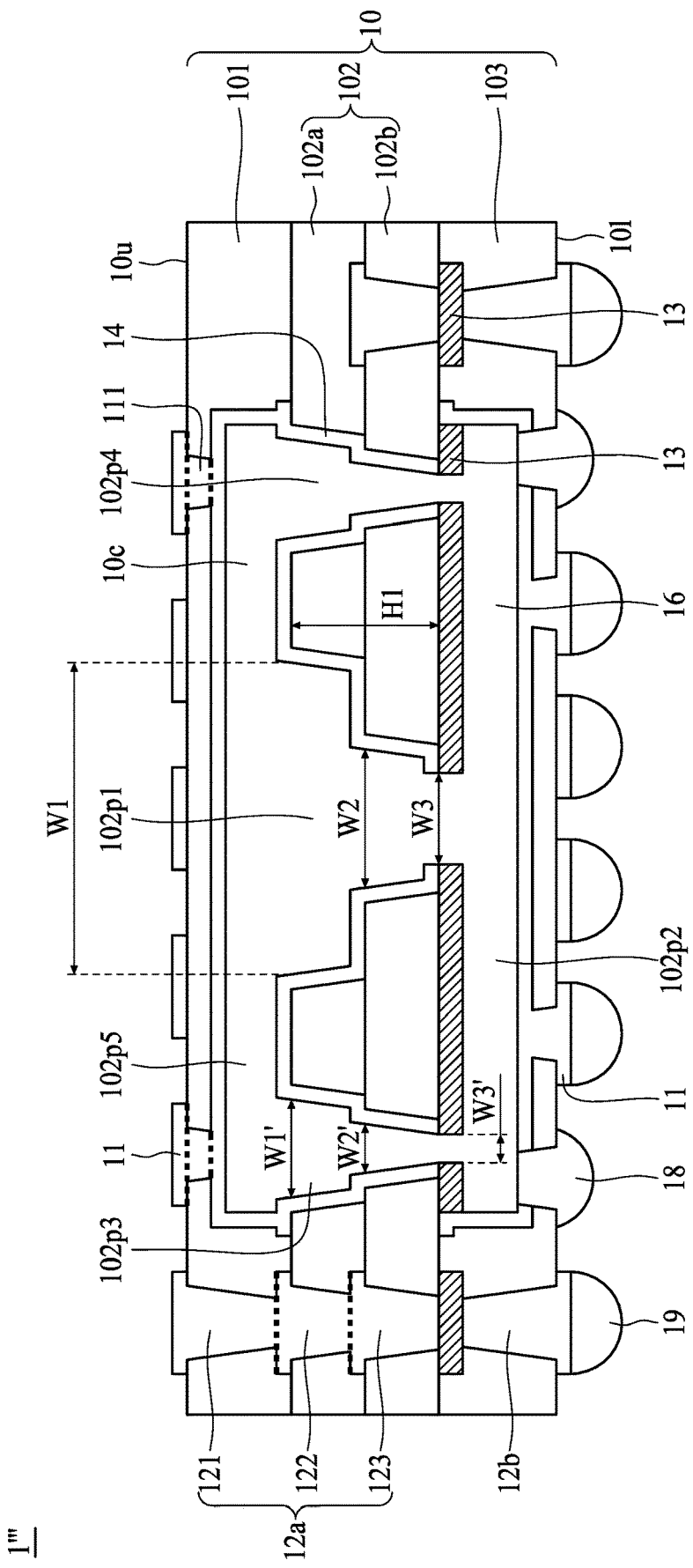
FIG. 1G illustrates a cross-sectional view of a semiconductor trace structure according to some embodiments of the present disclosure.

FIG. 1G is a cross-sectional view of a semiconductor trace structure 1'" according to some embodiments of the present disclosure. The structure of FIG. 1G is similar to the structure of FIG. 1A except that a grounding via 111 electrically connects the conductive pad 11 at the first surface 10*u* to the conductive layer 14 lining the inner wall of the cavity 10*c*. Alternatively, the grounding via 111 can be placed to electrically connect the conductive pad 11 at second surface 101 and the conductive layer 14. In either of the embodiments discussed above, the conductive pad 11, the grounding via 111, the patterned conductive layer 13, and the conductive layer 14 form a grounding path.

Figure 2A:
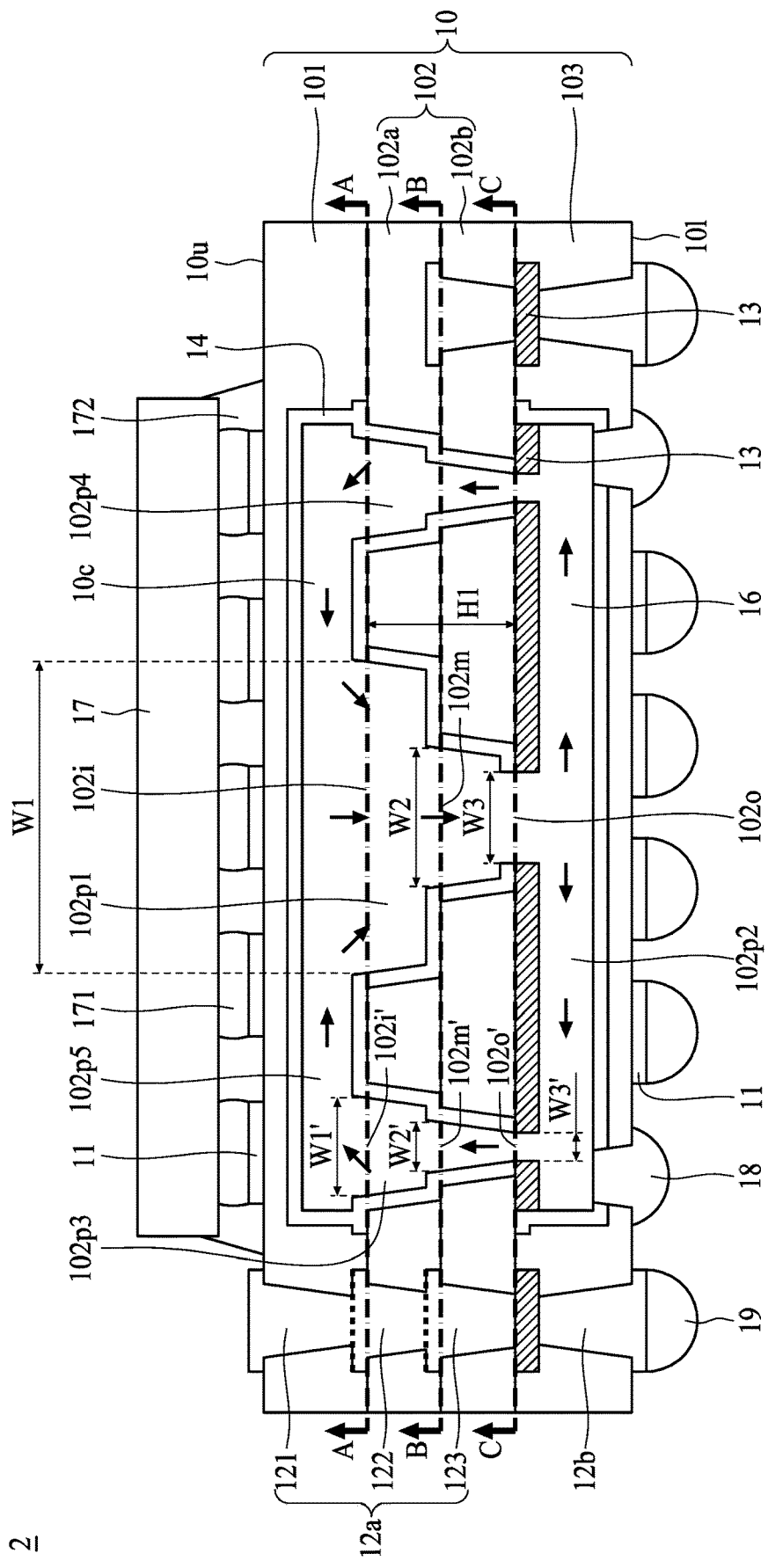
FIG. 2A illustrates a cross-sectional view of a semiconductor package structure according to some embodiments of the present disclosure.

FIG. 2A is a cross-sectional view of a semiconductor package structure 2 in accordance with some embodiments of the present disclosure. The semiconductor package structure 2 includes the semiconductor trace structure 1 and a semiconductor device 17. As described in FIG. 1A, the semiconductor trace structure 1 may be a substrate having a thickness of about 100 μm or a bumping structure having a thickness of about 10 μm. The cavity 10C defined by the dielectric structure 10 may accommodate a fluid 16. The fluid 16 may completely fill or partially fill the cavity 10C. In some embodiments, the semiconductor package structure 2 includes a cavity 10C without being filled or partially filled by the fluid 16.

The semiconductor device 17 is disposed on the upper surface 10*u* of the dielectric structure 10. The semiconductor device 17 includes a heat source. The semiconductor device 17 may include one or more heat sources. As shown in FIG. 2A, the heat source of the semiconductor device 17 is directly over the passage portion 102*p*1. A minor dimension W1 of the passage portion 102*p*1 is greater than either the minor dimension W1' of the passage portion 102*p*3 or the minor dimension W1" of the passage portion 102*p*4. Although not shown in FIG. 2A, in some embodiments, when a power chip is concerned, the heat sources of the semiconductor device 17 can be directly over the passage portion 102*p*3 and the passage portion 102*p*4. Under such circumstances, a minor dimension W1 of the passage portion 102*p*1 is smaller than either the minor dimension W1' of the passage portion 102*p*3 or the minor dimension W1" of the passage portion 102*p*4. Alternatively stated, the location of the passage portion or passage portions with greater or greatest width can be adapted for the location of the heat sources on the semiconductor device 17. In other embodiments, multiple semiconductor devices can be disposed on the upper surface 10u. The location of the passage portion or passage portions with greater or greatest width can be adapted for the location of the multiple semiconductor devices, as will be further discussed in FIG. 4B.

The semiconductor device 17 includes a conductive pad 171. The conductive pad 171 may transmit the heat generated by the heat source. The semiconductor device 17 is surrounded by an underfill 172. The cavity 10C is under the projection of the semiconductor device 17. In some embodiments, the size of the semiconductor device 17 may be adjusted. In some embodiments, the semiconductor device 17 may include an application-specific integrated circuit (ASIC), a controller, a processor or other electronic component or semiconductor device. The semiconductor device 17 is a flip chip.

The conductive pad 11 is disposed on the upper surface 10u of the dielectric structure 10. The conductive pad 11 disposed on the upper surface 10u is electrically connected to the conductive pad 171 of the semiconductor device 17. The conductive pad 11 is disposed on the lower surface 101 of the dielectric structure 10. The conductive pad 11 disposed on the lower surface 101 of the dielectric structure 10 is electrically connected to the connection element 19.

In some embodiments, a protection layer may be disposed on the upper surface 10u of the dielectric structure 10. The protection layer may be disposed on the lower surface 101 of the dielectric structure 10. The protection layer covers the conductive pad 11. The protection layer surrounds the conductive pad 171 of the semiconductor device 17. The protection layer may be a solder resist layer. In some embodiments, the protection layer may be omitted.

The semiconductor device 17 above the cavity 10C defines a heat-effect zone in the portion of the semiconductor trace structure underlying such semiconductor device 17. The heat-effect zone can be defined against the non-effect zone in the portion of the semiconductor trace structure free from coverage of such semiconductor device 17. The semiconductor device 17 covers the passage portions 102p1, 102p3, 102p4, and the guidance portions 102p2, 102p5. The passage portions 102p1, 102p3, 102p4, and the guidance portions 102p2, 102p5. are under the projection of the heat source, for example, the semiconductor device 17. According to ideal fluid equation, PV=nRT, pressure of the fluid 16 in each portion is positively correlated to the temperature of the fluid 16 in said corresponding portion. The cavity 10C is so designed to drive the fluid 16 flowing from the input portion 102i (with higher temperature and pressure) through the body of the passage portion 102p1 to the output portion 102o (with lower temperature and pressure). That is, the temperature and pressure at the input portion 102i is greater than those at the middle portion 102m. The temperature and pressure at the middle portion 102m is greater than those at the output portion 102o. Subsequently, the pressure caused by temperature difference continues to drive the fluid 16 from the output portion 102o back to the input portion 102i through other passage portions (e.g. the passage portions 102p3, 102p4) and guidance portions 102p2, 102p5, thereby completing a circulation cycle for heat dissipation. During the latter half of the circulation cycle, heat accumulated at both ends of the guidance portion 102p5 can be dissipated through the convection of the fluid 16, that is, flowing from both ends of the guidance portion 102p5 toward the input portion 102i, thereby further raising the temperature at the center of the guidance portion 102p5 and fostering the pressure differential between the input portion 102i and the output portion 102o of the passage portion 102p1. The width W1 of the input portion 102i is greater than the width W1' of the input portion 102i'. Such design effectively drives the circulation cycle. The shape of the passage portion 102p1 may facilitate the circulation cycle and heat dissipation. The tapered profile of the passage portion 102p1 increases the flow speed of the fluid 16, as will be addressed later in the present disclosure. The conductive layers 13 and 14 may facilitate heat dissipation during the circulation of the fluid 16.

Figure 2B:
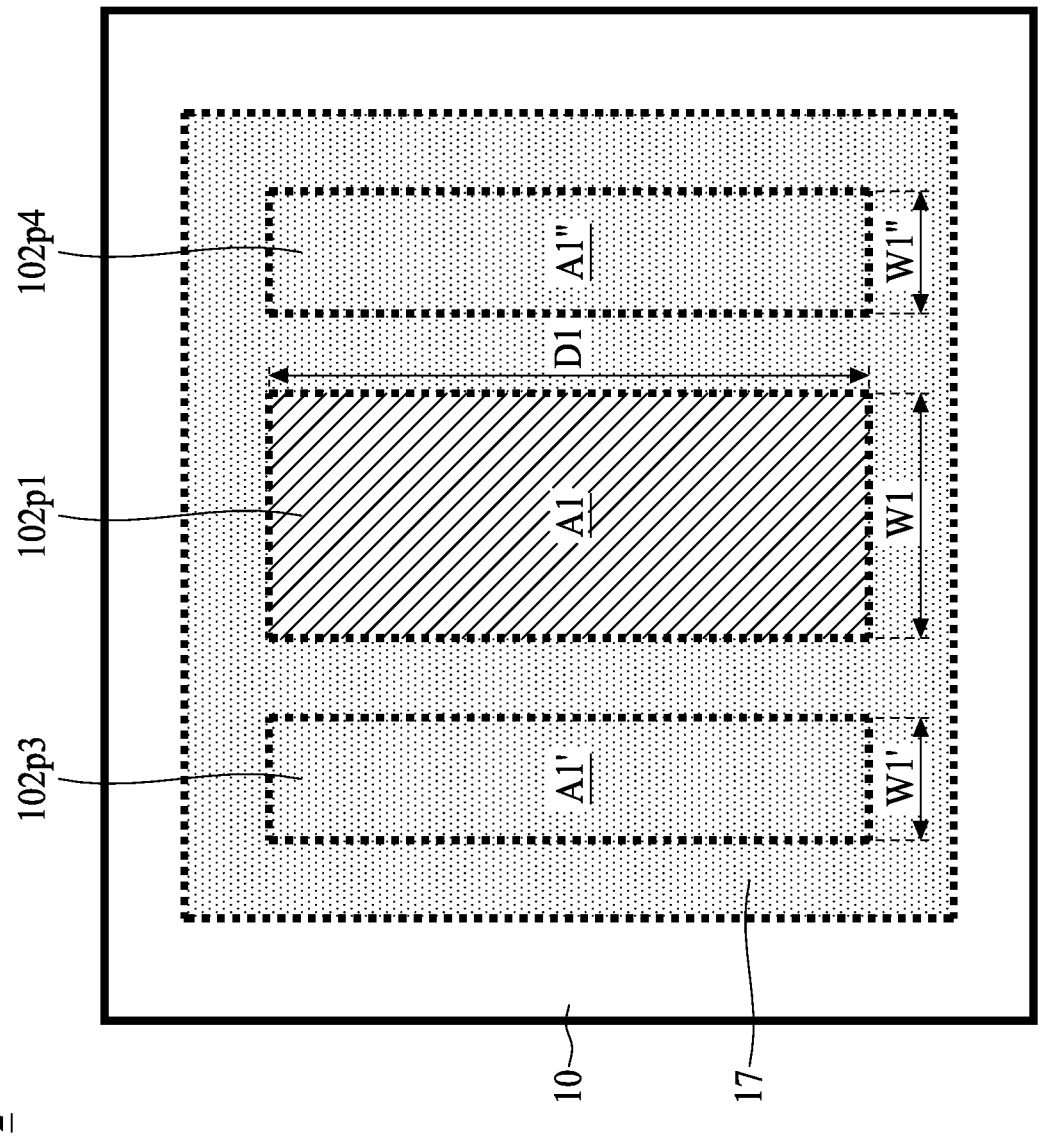
FIG. 2B illustrates a first top view of a semiconductor package structure across line A-A in FIG. 2A according to some embodiments of the present disclosure.

FIG. 2B illustrates a first top view of the semiconductor package structure 2 across line A-A in FIG. 2A in accordance with some embodiments of the present disclosure. The semiconductor device 17 completely covers the passage portions 102p1, 102p3, 102p4. The passage portion 102p1 has a principal or major dimension D1 (e.g., the length) from the first top view perspective. The passage portion 102p1 has a minor dimension W1 (e.g., the width) from the first top view perspective. The passage portion 102p1 has an area A1 enclosed by the principal or major dimension D1 and the minor dimension W1 from the first top view perspective.

The passage portion 102p3 has a principal or major dimension D1 (e.g., the length) from the first top view perspective. The passage portion 102p3 has a minor dimension W1' (e.g., the width) from the first top view perspective. The passage portion 102p3 has an area A1' enclosed by the principal or major dimension D1 and the minor dimension W1' from the first top view perspective. The passage portion 102p4 has a principal or major dimension D1 (e.g., the length) from the first top view perspective. The passage portion 102p4 has a minor dimension W1" (e.g., the width) from the first top view perspective. The passage portion 102p4 has an area A1" enclosed by the principal or major dimension D1 and the minor dimension W1" from the first top view perspective. In some embodiments, hatched lines are provided over the area A1 of the passage portion 102p1 but not over the areas A1' and A1" of the passage portions 102p3, 102p4, indicating that the fluid 16 may flow in a first direction in the passage portion 102p1 and in a second direction in the passage portions 102p3, 102p4. The first direction can be opposite to the second direction.

Figure 2C:
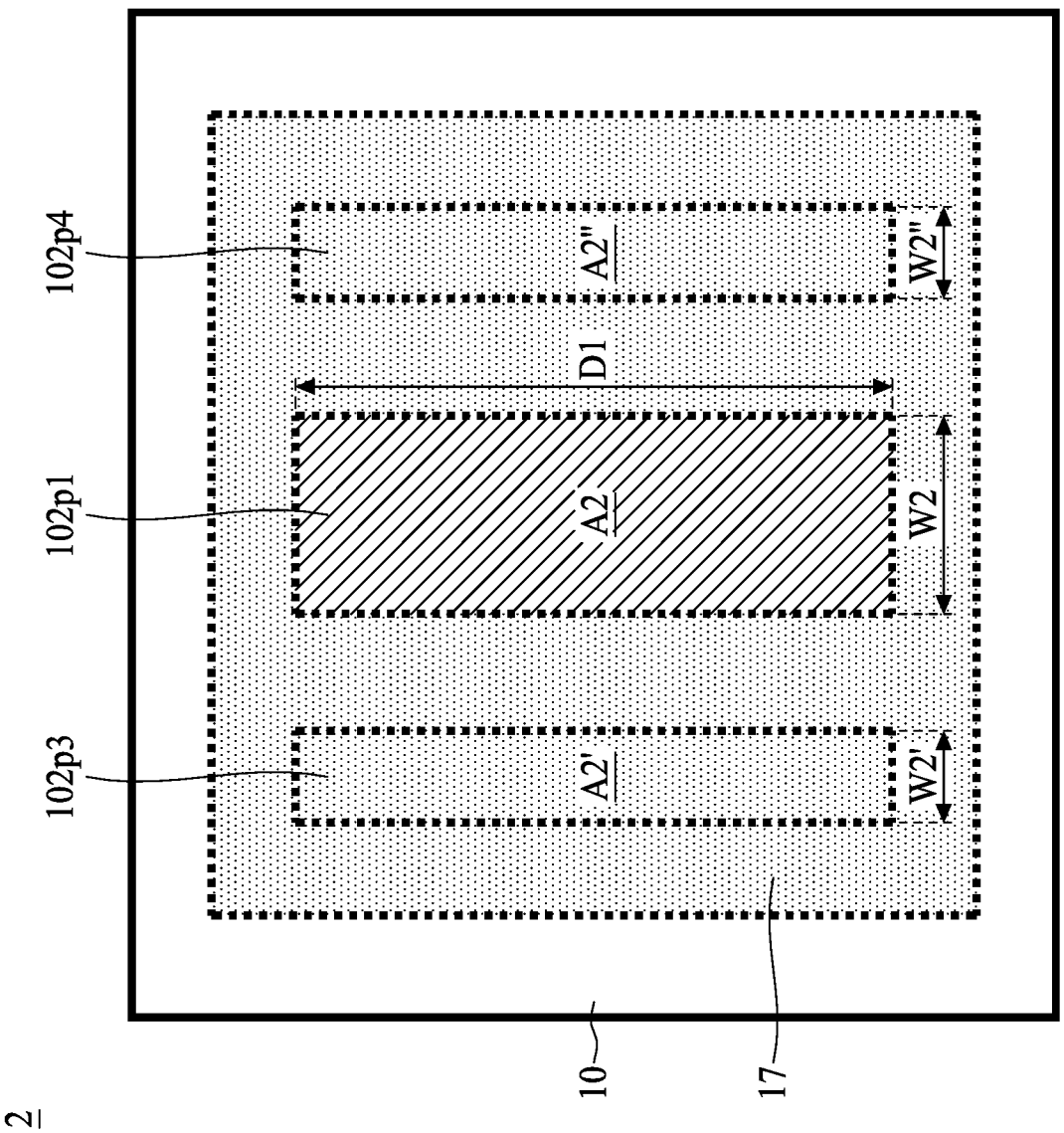
FIG. 2C illustrates a second top view of a semiconductor package structure across line B-B in FIG. 2A according to some embodiments of the present disclosure.

FIG. 2C illustrates a second top view of the semiconductor package structure 2 across line B-B in FIG. 2A in accordance with some embodiments of the present disclosure. The passage portion 102p1 has a principal or major dimension D1 (e.g., the length) from the second top view perspective. The passage portion 102p1 has a minor dimension W2 (e.g., the width) from the second top view perspective. The passage portion 102p1 has an area A2 enclosed by the principal or major dimension D1 and the minor dimension W2 from the second top view perspective.

The passage portion 102p3 has a principal or major dimension D1 (e.g., the length) from the second top view perspective. The passage portion 102p3 has a minor dimension W2' (e.g., the width) from the second top view perspective. The passage portion 102p3 has an area A2' enclosed by the principal or major dimension D1 and the minor dimension W2' from the second top view perspective. The passage portion 102p4 has a principal or major dimension D1 (e.g., the length) from the second top view perspective. The passage portion 102p4 has a minor dimension W2" (e.g., the width) from the second top view perspective. The passage portion 102p4 has an area A2" enclosed by the principal or major dimension D1 and the minor dimension W2" from the second top view perspective. The area A2 is greater than either the area A2' or the area A2".

Figure 2D:
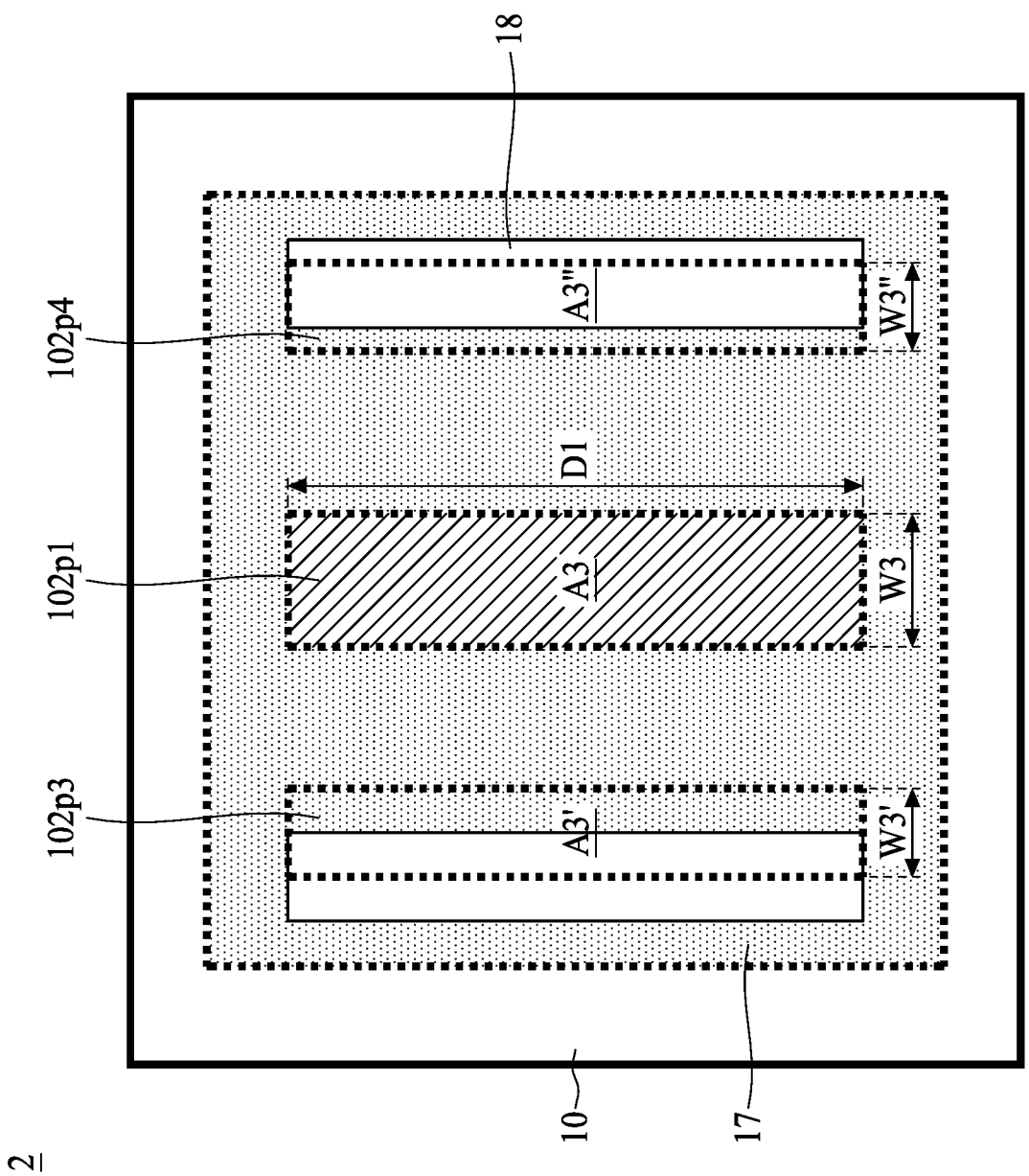
FIG. 2D illustrates a bottom view of a semiconductor package structure across line C-C in FIG. 2A according to some embodiments of the present disclosure.

FIG. 2D illustrates a bottom view of the semiconductor package structure 2 across line C-C in FIG. 2A in accordance with some embodiments of the present disclosure. The passage portion 102*p*1 has a principal or major dimension D1 (e.g., the length) from the bottom view perspective. The passage portion 102*p*1 has a minor dimension W3 (e.g., the width) from the bottom view perspective. The passage portion 102*p*1 has an area A3 enclosed by the principal or major dimension D1 and the minor dimension W3 from the bottom view perspective. Referring back to FIG. 2B, FIG. 2C, and FIG. 2D, the area A1 is greater than the area A2, and the area A2 is greater than the area A3. Such design effectively drives the fluid speed during circulation cycles.

The passage portion 102*p*3 has a principal or major dimension D1 (e.g., the length) from the bottom view perspective. The passage portion 102*p*3 has a minor dimension W3' (e.g., the width) from the bottom view perspective. The passage portion 102*p*3 has an area A3' enclosed by the principal or major dimension D1 and the minor dimension W3' from the bottom view perspective. The passage portion 102*p*4 has a principal or major dimension D1 (e.g., the length) from the bottom view perspective. The passage portion 102*p*4 has a minor dimension W3" (e.g., the width) from the bottom view perspective. The passage portion 102*p*4 has an area A3" enclosed by the principal or major dimension D1 and the minor dimension W3" from the bottom view perspective. The sealing element 18 partially overlaps the passage portions 102*p*3 and 102*p*4. In some embodiments, the sealing element 18 may completely overlaps the passage portions 102*p*3 and 102*p*4.

In addition to the pressure differential that causes the fluid 16 to perform circulation motion, as addressed previously in FIG. 2A, the tapered profile of the passage portion 102*p*1 effectively enhances the flow speed of the fluid 16 when the fluid flowing from the input portion 102*i* toward the output portion 102*o*. Since the area A1 in FIG. 2B is greater than the area A2 in FIG. 2C, and the area A2 in FIG. 2B is greater than the area A3 in FIG. 2D, flow speed of the incompressible fluid will be increased when flowing from the greater area region proximal to the input portion 102*i* toward smaller area region proximal to the output portion 102*o*. This effect is referred to as a "funneling" effect.

Figure 3A:
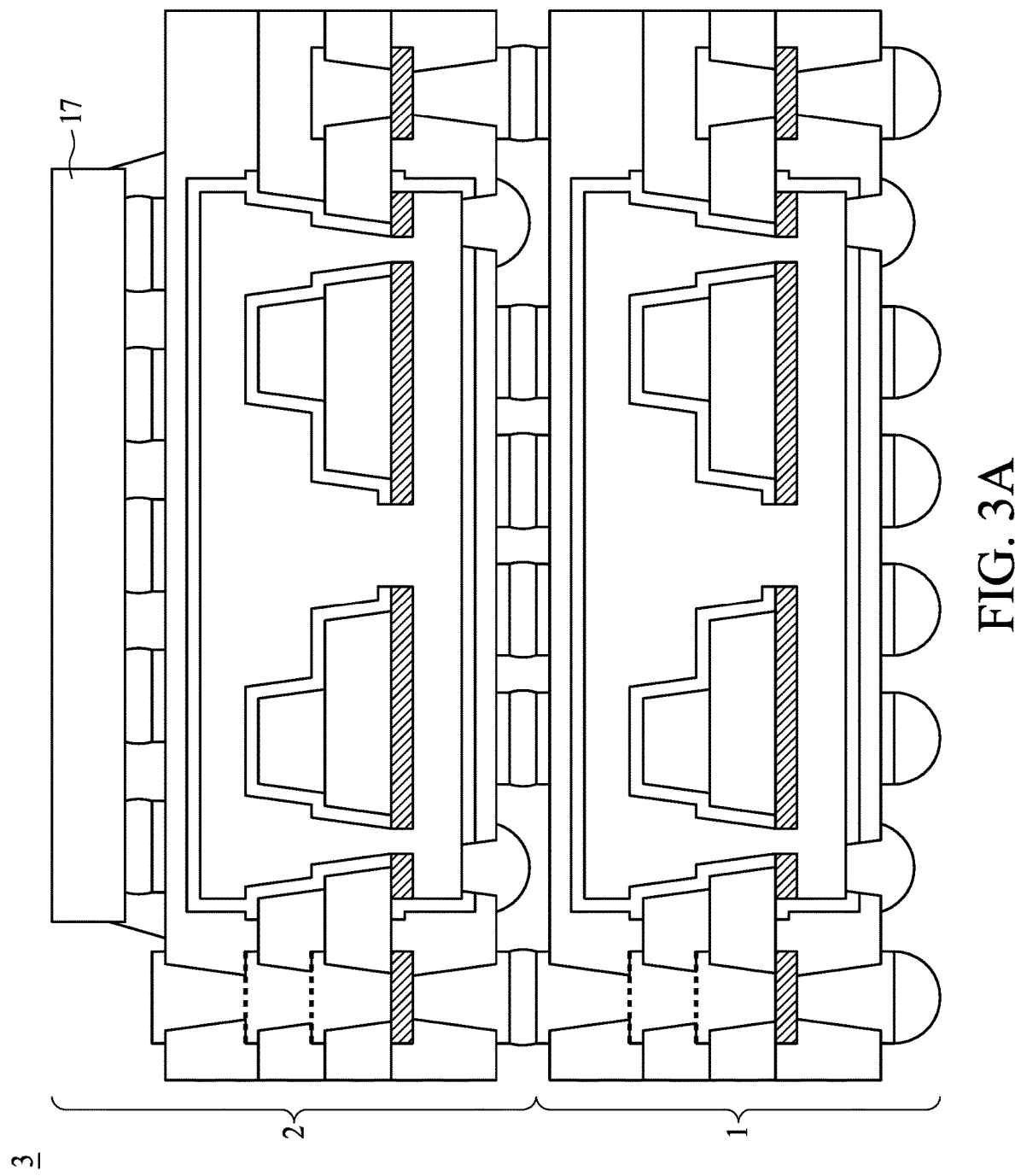
FIG. 3A illustrates a cross-sectional view of a semiconductor package structure according to some embodiments of the present disclosure.

FIG. 3A illustrates a cross-sectional view of a semiconductor package structure 3 according to some embodiments of the present disclosure. The semiconductor package structure 3 includes the semiconductor trace structure 1 and the semiconductor package structure 2. The semiconductor package structure 3 is a device-on-device package structure. The heat generated from the semiconductor device 17 is first passed to the semiconductor trace structure of the semiconductor package structure 2 and subsequently passed to the semiconductor trace structure 1. The semiconductor trace structure 1 enhances the heat dissipation.

Figure 3B:
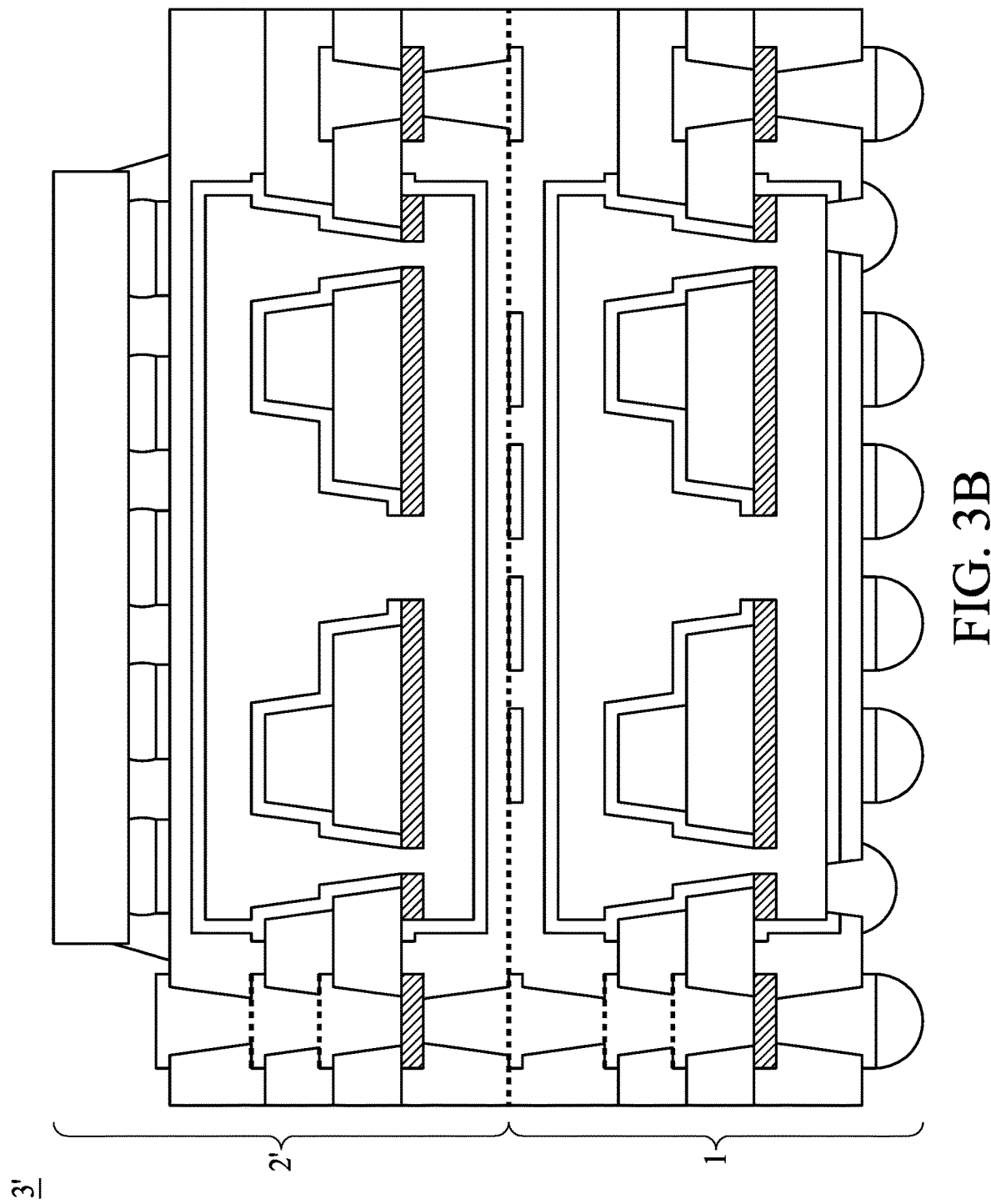
FIG. 3B illustrates a cross-sectional view of a semiconductor package structure according to some embodiments of the present disclosure.

FIG. 3B illustrates a cross-sectional view of a semiconductor package structure 3' according to some embodiments of the present disclosure. The semiconductor package structure 3' is similar to the structure of FIG. 3A except that a semiconductor package structure 2 and the semiconductor trace structure 1 in the semiconductor package structure 3' is integrated by the dielectric layers and is not bonded through connection element 19. The semiconductor package structure 3' is a multi-unit package structure. The heat generated from the semiconductor device 17 is first passed to the semiconductor trace structure of the semiconductor package structure 2' and subsequently passed to the semiconductor trace structure 1. The semiconductor trace structure 1 enhances the heat dissipation.

Figure 4A:
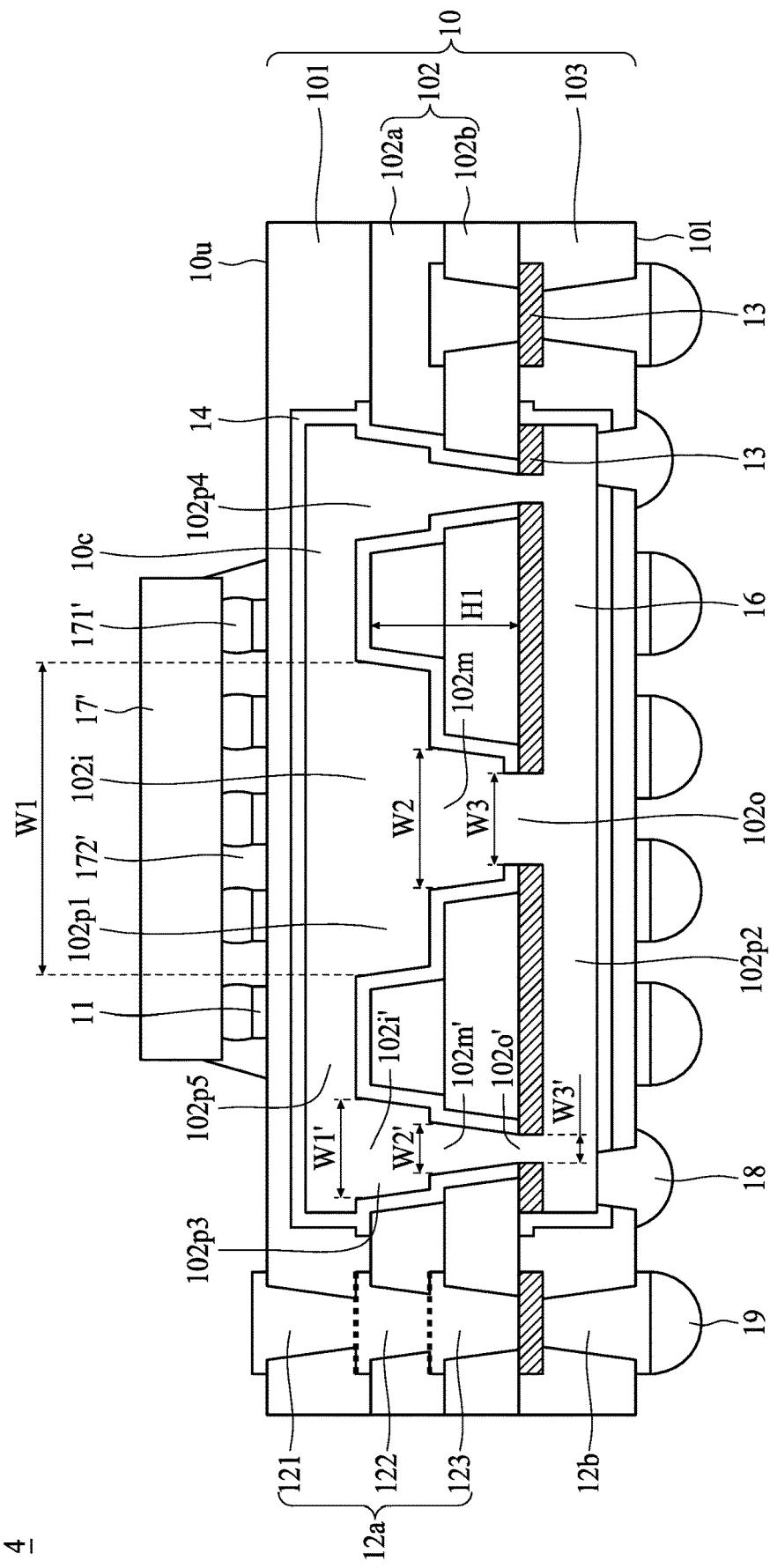
FIG. 4A illustrates a cross-sectional view of a semiconductor package structure according to some embodiments of the present disclosure.

FIG. 4A illustrates a cross-sectional view of a semiconductor package structure 4 according to some embodiments of the present disclosure. The semiconductor package structure 4 is similar to the structure of FIG. 1A except that a width of a semiconductor device 17' is smaller than that of the semiconductor device 17 of FIG. 1A. The semiconductor device 17' includes a conductive bump 171' and a conductive pad 11. The conductive bump 171' and the conductive pad 11 are surrounded by an underfill 172'.

The semiconductor device 17' includes a heat source. For example, the semiconductor device 17' can effectively be a uniform heat source generating heat across the entire body of the semiconductor device 17'. For another example, the semiconductor device 17' can be effectively be a non-uniform heat source generating most of the heat from predetermined locations across the body of the semiconductor device 17'. In some embodiments, the semiconductor device 17' completely overlaps with the passage portion 102*p*1. In some embodiments, the semiconductor device 17' partially overlaps with the guidance portions 102*p*2 and 102*p*5. The passage portions 102*p*3 and 102*p*4 are away from the projection of the heat source of the semiconductor device 17'. The heat generated from the heat source may be directly passed to the passage portion 102*p*1. Heat generated by the heat source drives the circulation motion of the fluid, as previously described.

Figure 4B:
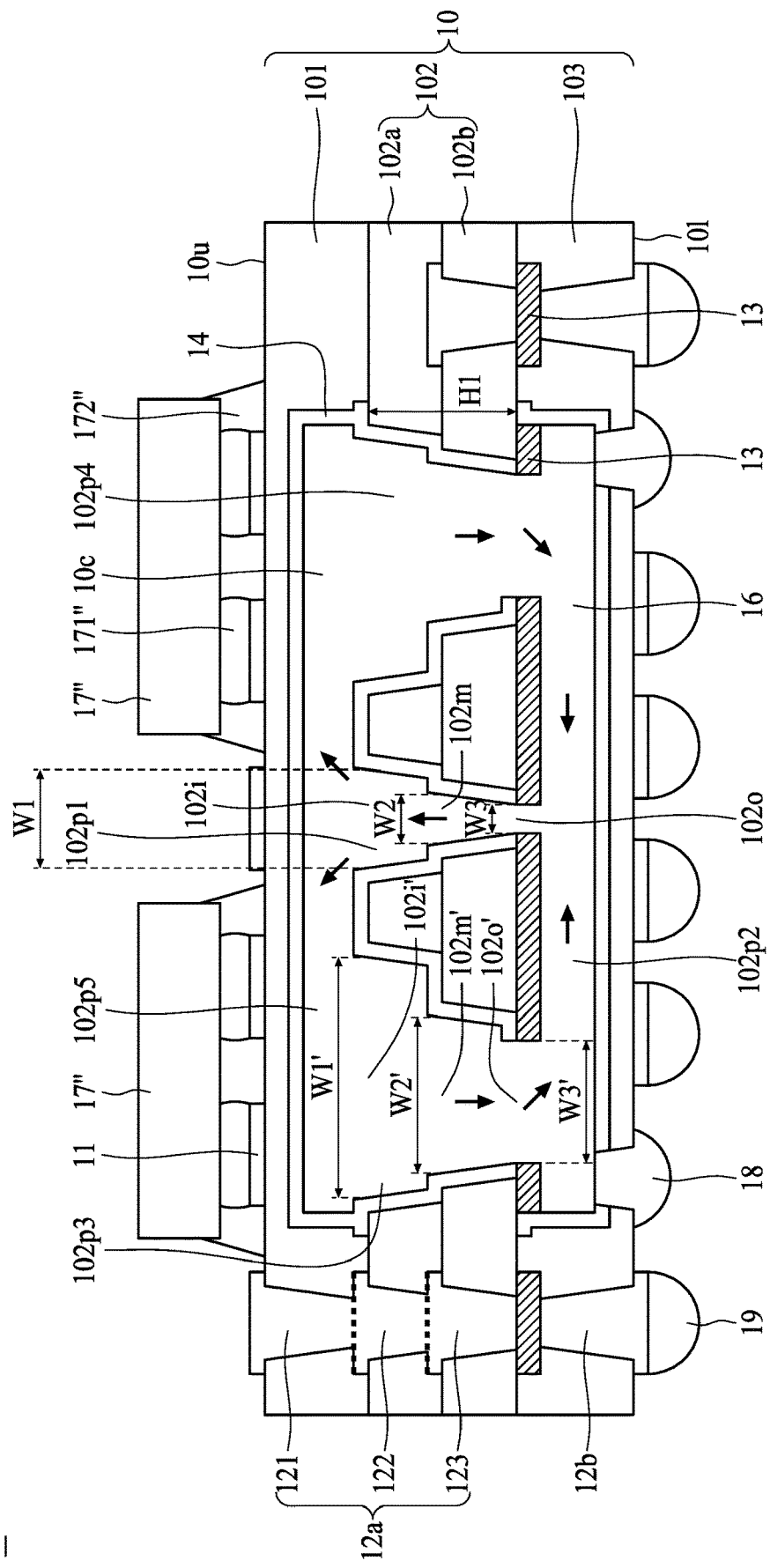
FIG. 4B illustrates a cross-sectional view of a semiconductor package structure according to some embodiments of the present disclosure.

FIG. 4B illustrates a cross-sectional view of a semiconductor package structure 4' according to some embodiments of the present disclosure. The semiconductor package structure 4' is similar to the structure of FIG. 4A except that one semiconductor device 17" is disposed over the passage portion 102*p*3 and another semiconductor device 17" is disposed over the passage portion 102*p*4. The semiconductor package structure 4' is a multi-chip structure. The width W1' of the passage portion 102*p*3 is greater than the width W1 of the passage portion 102*p*1. The width W2' of the passage portion 102*p*3 is greater than the width W2 of the passage portion 102*p*1. The width W3' of the passage portion 102*p*3 is greater than the width W3 of the passage portion 102*p*1. Accordingly, heat generated by the heat sources of the two semiconductor devices drives the fluid 16 to perform two circulation cycles independently. As previously discussed, the location of the passage portion or passage portions with greater or greatest width can be adapted for the location of the multiple semiconductor devices.

Figure 4C:
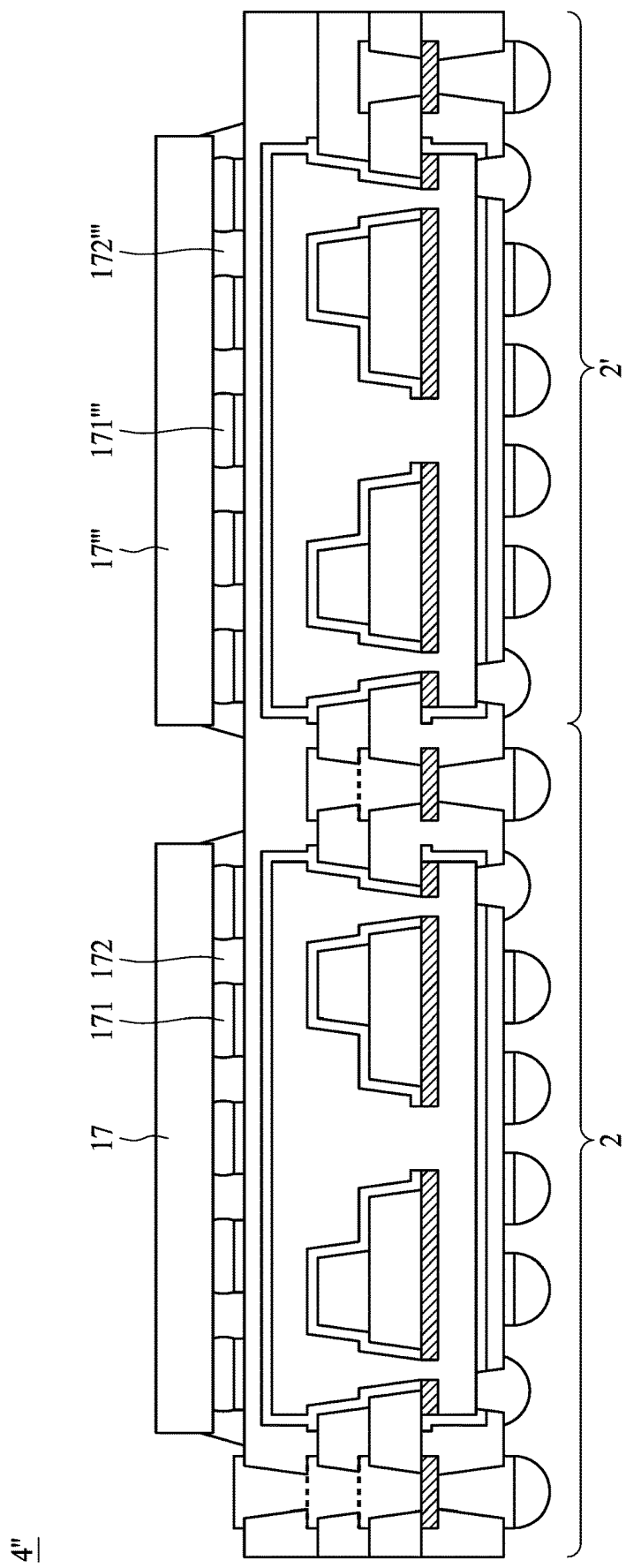
FIG. 4C illustrates a cross-sectional view of a semiconductor package structure according to some embodiments of the present disclosure.

FIG. 4C illustrates a cross-sectional view of a semiconductor package structure 4" according to some embodiments of the present disclosure. The semiconductor package structure 4" is similar to the structure of FIG. 2A except that a semiconductor package structure 4" is integrated, side-by-side, with two semiconductor package structures 2 of FIG. 2A. The semiconductor package structure 4" includes a semiconductor device 17'''. The semiconductor device 17''' includes a conductive bump 171'''. The conductive bump 171''' is surrounded by an underfill 172'''. The type of the semiconductor device 17''' is different from that of the semiconductor device 17.

Figure 4D:
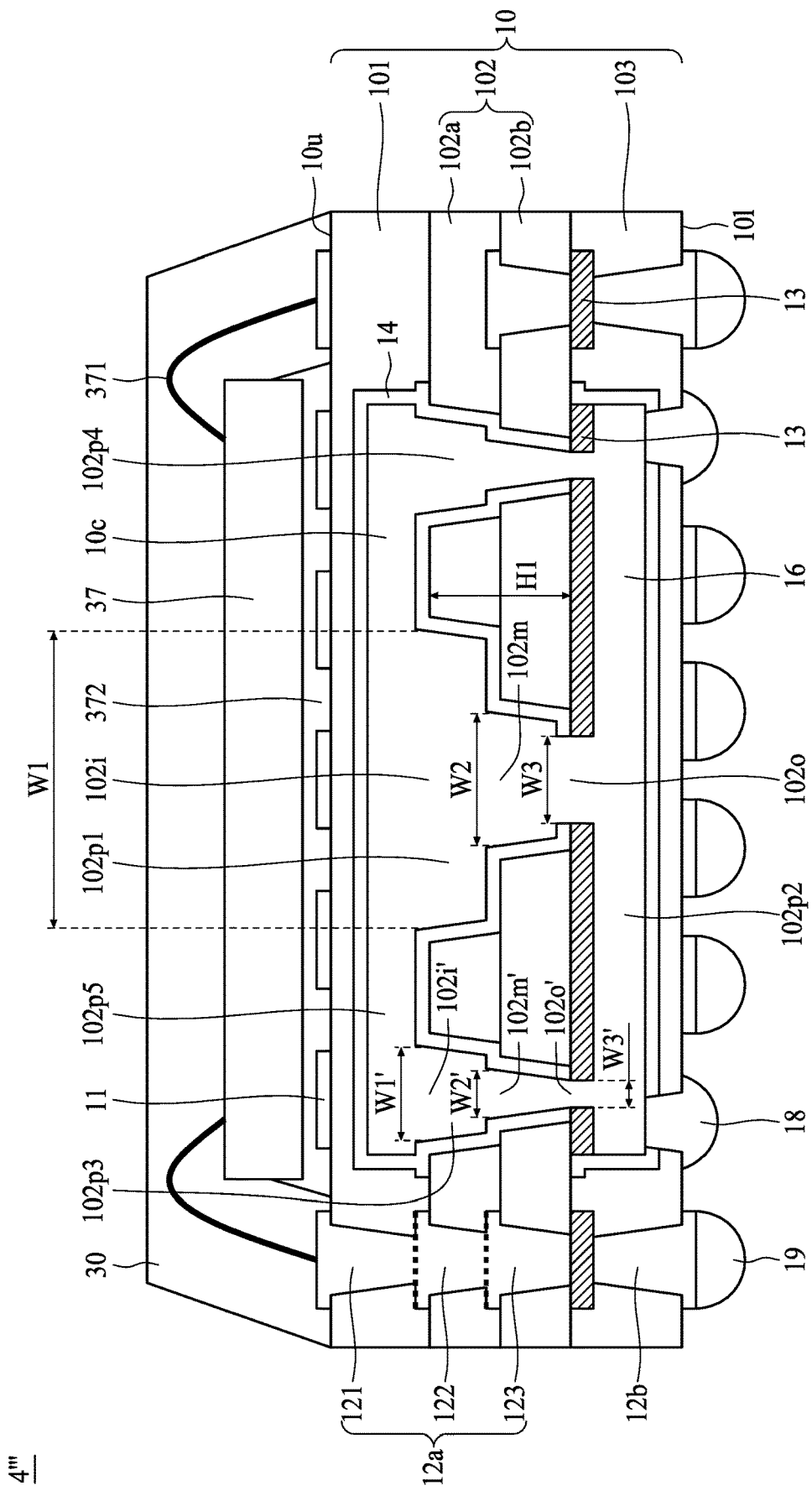
FIG. 4D illustrates a cross-sectional view of a semiconductor package structure according to some embodiments of the present disclosure.

FIG. 4D illustrates a cross-sectional view of a semiconductor package structure 4''' according to some embodiments of the present disclosure. The semiconductor package structure 4''' is similar to the structure of FIG. 2A except that an active surface of a semiconductor device 37 faces toward a direction away from the upper surface 10*u* of the dielectric structure 10. The semiconductor device 37 is a wire-bonding chip. The semiconductor device 37 includes a bonding wire 371. An underfill 372 surrounds the semiconductor device 37. An encapsulant 30 encapsulates the semiconductor device 37. The encapsulant 30 encapsulates the conductive wire 371 and the interconnection conductive structure 12*a*.

Figure 4E:
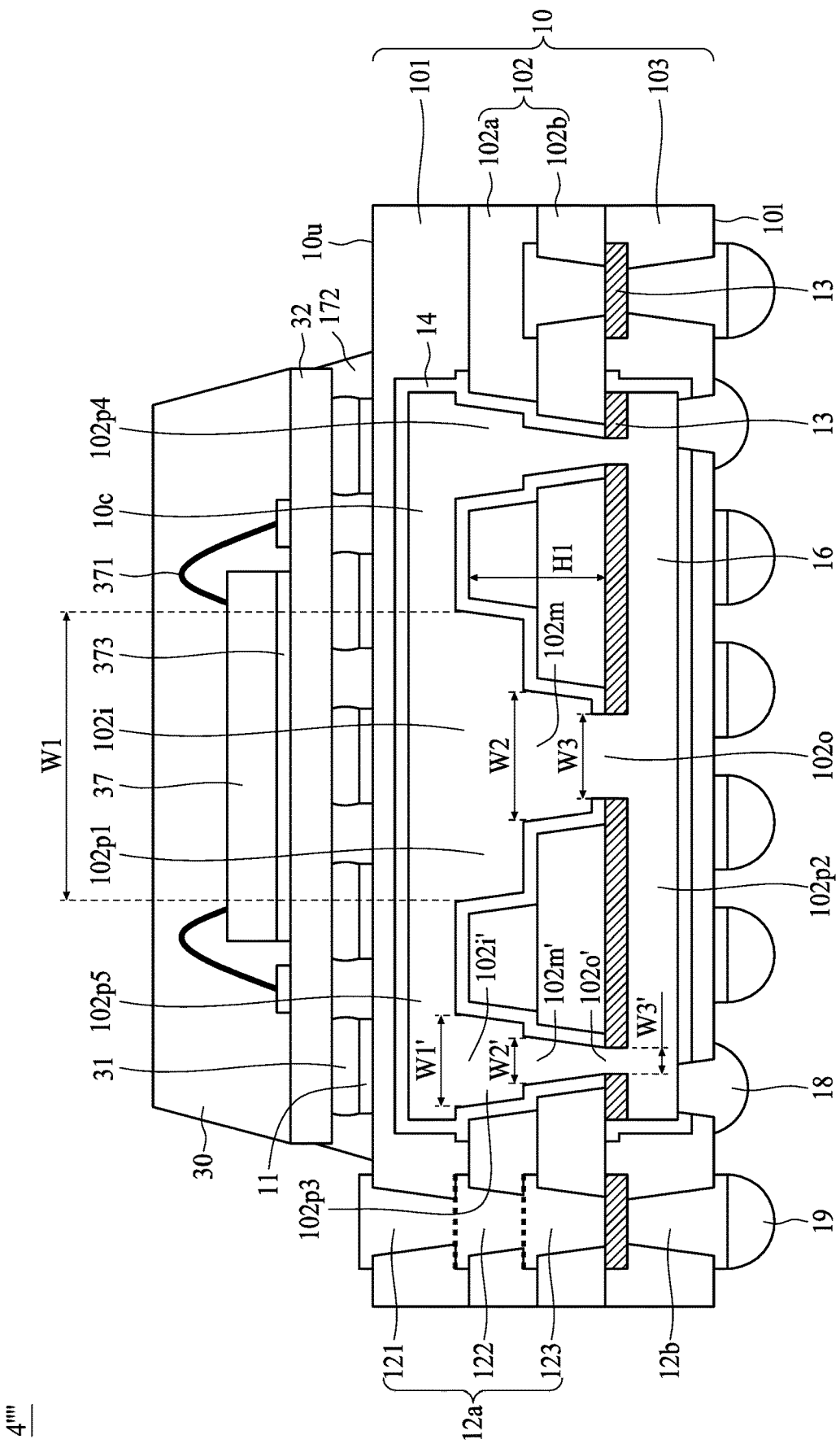
FIG. 4E illustrates a cross-sectional view of a semiconductor package structure according to some embodiments of the present disclosure.

FIG. 4E illustrates a cross-sectional view of a semiconductor package structure 4'''' according to some embodiments of the present disclosure. The semiconductor package structure 4'''' is similar to the structure of FIG. 4D except that the semiconductor device 37 is disposed on a circuit structure 32. The circuit structure 32 is bonded to the underlying semiconductor trace structure through a connection element 31. The connection element 31 is surrounded by the underfill 172. The semiconductor package structure 4'''' is a package-on-package (PoP) structure.

Figure 5A:
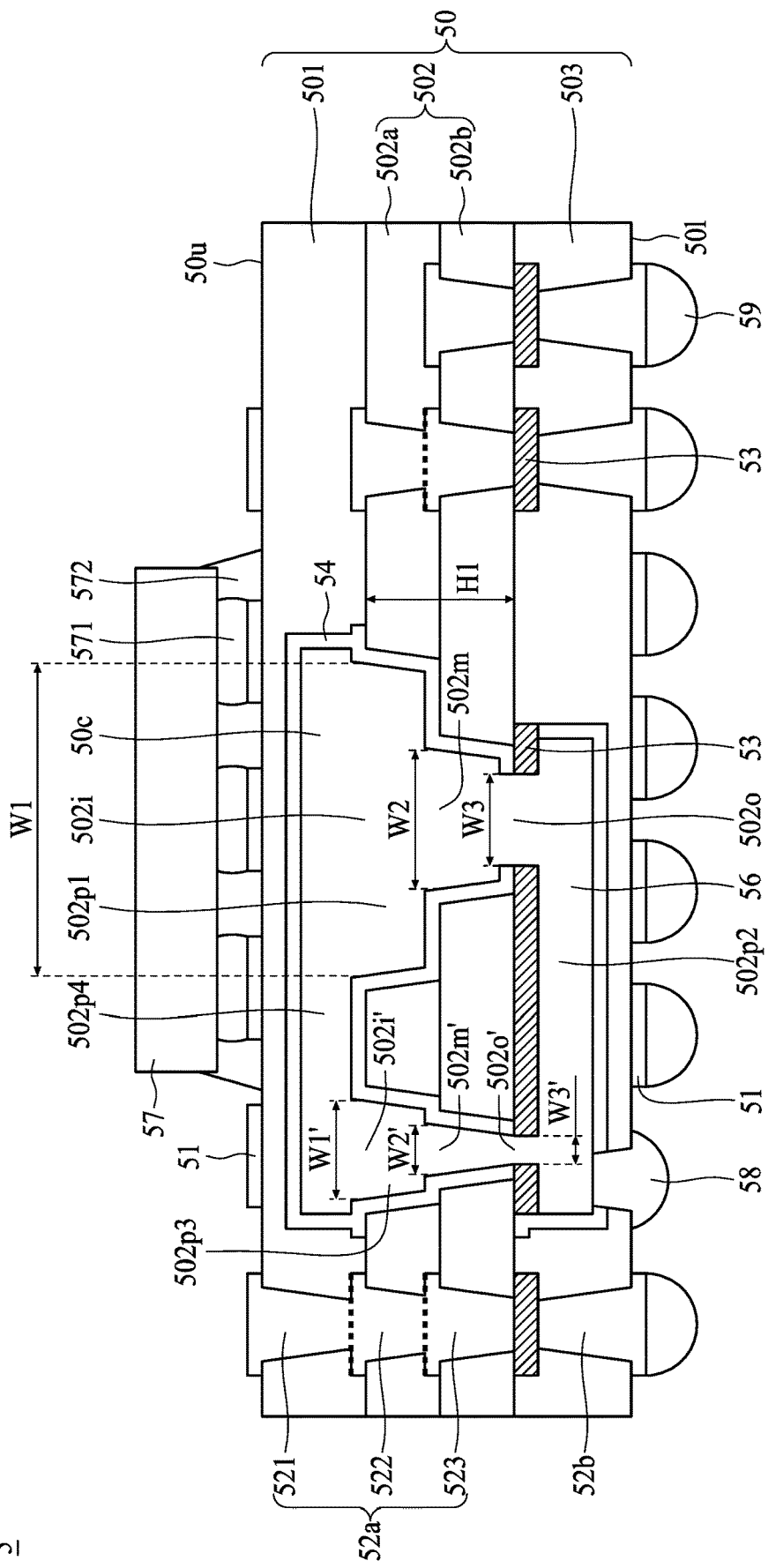
FIG. 5A illustrates a cross-sectional view of a semiconductor package structure according to some embodiments of the present disclosure.

FIG. 5A illustrates a cross-sectional view of a semiconductor package structure 5 according to some embodiments of the present disclosure. The semiconductor package structure 5 is similar to the structure of FIG. 2A except that its cavity 50C includes two passage portions 502p1, 502p3, in addition to two guidance portions 502p4, 502p2.

The semiconductor package structure 5 includes a dielectric structure 50, the cavity 50C, a conductive pad 51, an interconnection conductive structure 52a, an interconnection conductive structure 52b, a patterned conductive layer 53, a conductive layer 54, a semiconductor device 57, a sealing element 58, and a connection element 59. The cavity 50C defined by the dielectric structure 50 may accommodate a fluid 56. The fluid 56 may completely fill or partially fill the cavity 50C. In some embodiments, the semiconductor package structure 5 includes a cavity 50C without being filled or partially filled by the fluid 56.

The dielectric structure 50 has an upper surface 50u and a lower surface 501. The upper surface 50u is opposite to the lower surface 501. The dielectric structure 50 may be a multi-layer structure. The dielectric structure 50 includes a dielectric layer 501, a dielectric layer 502, and a dielectric layer 503. The dielectric layer 502 includes a dielectric layer 502a and a dielectric layer 502b.

The conductive pad 51 is disposed on the upper surface 10u of the dielectric structure 50. The conductive pad 51 is disposed on the lower surface 101 of the dielectric structure 50. The patterned conductive layer 53 is disposed on a lower surface of the dielectric layer 502b.

The cavity 50C includes a passage portion 502p1 extending between the upper surface 50u and the lower surface 501 of the dielectric structure 50. The passage portion 502p1 has a principal dimension H1 from a cross sectional perspective. The cavity 50C includes a passage portion 502p3 extending between the upper surface 50u and the lower surface 501 of the dielectric structure 50. The passage portion 502p3 is in parallel with the passage portion 502p1. The cavity 50C includes a guidance portion 502p2 and a guidance portion 502p5 in parallel with the passage portion 502p2. The guidance portion 502p2 is perpendicular to the passage portion 502p1. In some embodiments, the passage portion 502p1 comprises a tapered profile or a step profile. The passage portion 502p1 comprises a multi-step profile. The passage portion 502p3 comprises a tapered profile or a step profile.

The passage portion 502p1 includes an input portion 502i in proximity to the upper surface 50u of the dielectric structure 50, an output portion 502o in proximity to the lower surface 501 of the dielectric structure 50, and a middle portion 502m between the input portion 502i and the output portion 502o. The input portion 502i includes a width W1. The middle portion 502m includes a width W2. The output portion 502o includes a width W3. The width W1 is greater than the width W2. The width W2 is greater than the width W3.

The passage portion 502p3 includes an input portion 502i' in proximity to the upper surface 50u of the dielectric structure 50, an output portion 502o' in proximity to the lower surface 501 of the dielectric structure 50, and a middle portion/zone 502m' between the input portion 502i' and the output portion 502o'. The input portion 502i' includes a width W1'. The middle portion 502m' includes a width W2'. The output portion 102o' includes a width W3'. The width W1' is greater than the width W2'. The width W2' is greater than the width W3'. The width W1' is less than the width W1. The width W2' is less than the width W2. The width W3' is less than the width W3.

The semiconductor device 57 is disposed on the upper surface 50u of the dielectric structure 50. The semiconductor device 57 includes a heat source. The semiconductor device 57 includes a conductive bump 571. The conductive bump 571 passes the heat generated by the heat source toward the underlying semiconductor trace structure. The semiconductor device 57 is surrounded by an underfill 572. The semiconductor device 57 partially overlaps with the guidance portions 502p4 and 502p2. The semiconductor device 57 completely overlaps with the passage portion 502p1. Note the semiconductor device 57 is position over the input portion 502i with the width W1 instead of positioned over the input portion 502i' with the width W1'. The width W1 is greater than the width W1'. As previously addressed, the location of the passage portion or passage portions with greater width can be adapted for the location of the heat sources on the semiconductor device 17. Such design may facilitate to drive a circulation cycle.

Heat generated by the heat source of the semiconductor device 57 drives the circulation cycle from the passage portion 502p1, passing the guidance portion 502p2, the passage portion 502p3, and to the guidance portion 502p4. A single fluid circulation cycle can be observed in the embodiment depicted in FIG. 5A.

Figure 5B:
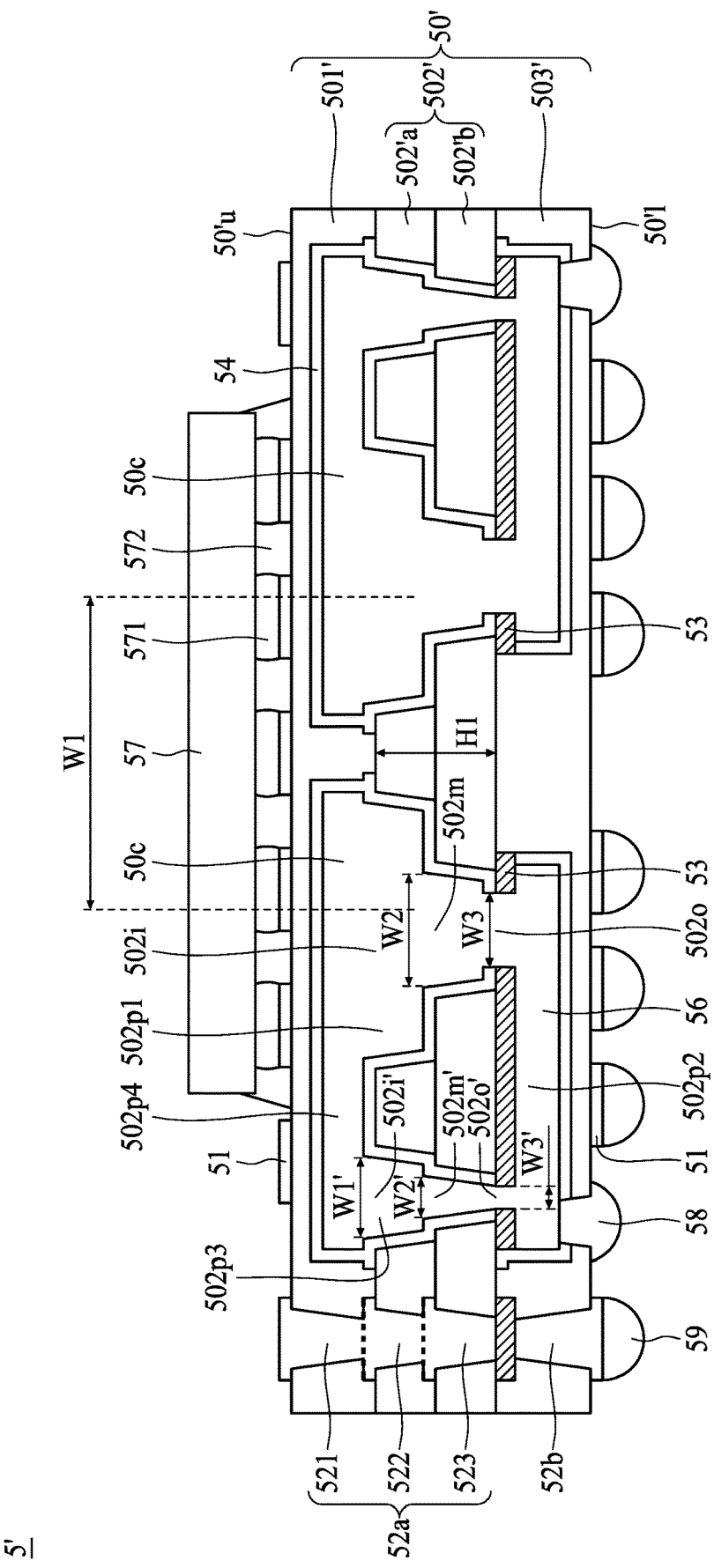
FIG. 5B illustrates a cross-sectional view of a semiconductor package structure according to some embodiments of the present disclosure.

FIG. 5B illustrates a cross-sectional view of a semiconductor package structure 5' according to some embodiments of the present disclosure. The semiconductor package structure 5' is similar to the structure of FIG. 5A except that a dielectric structure 50' includes two cavities 50C and that the size of a semiconductor device 57' is greater than that of the semiconductor device 57.

The semiconductor device 57' drives two fluid circulation cycles independently in the two cavities 50C, respectively. The two fluid circulation cycles in the two cavities 50C may further enhance heat dissipation by not having the heat source, or the semiconductor device 57', overlapping with the narrower passage portions, e.g., 502p3.

Figure 5C:
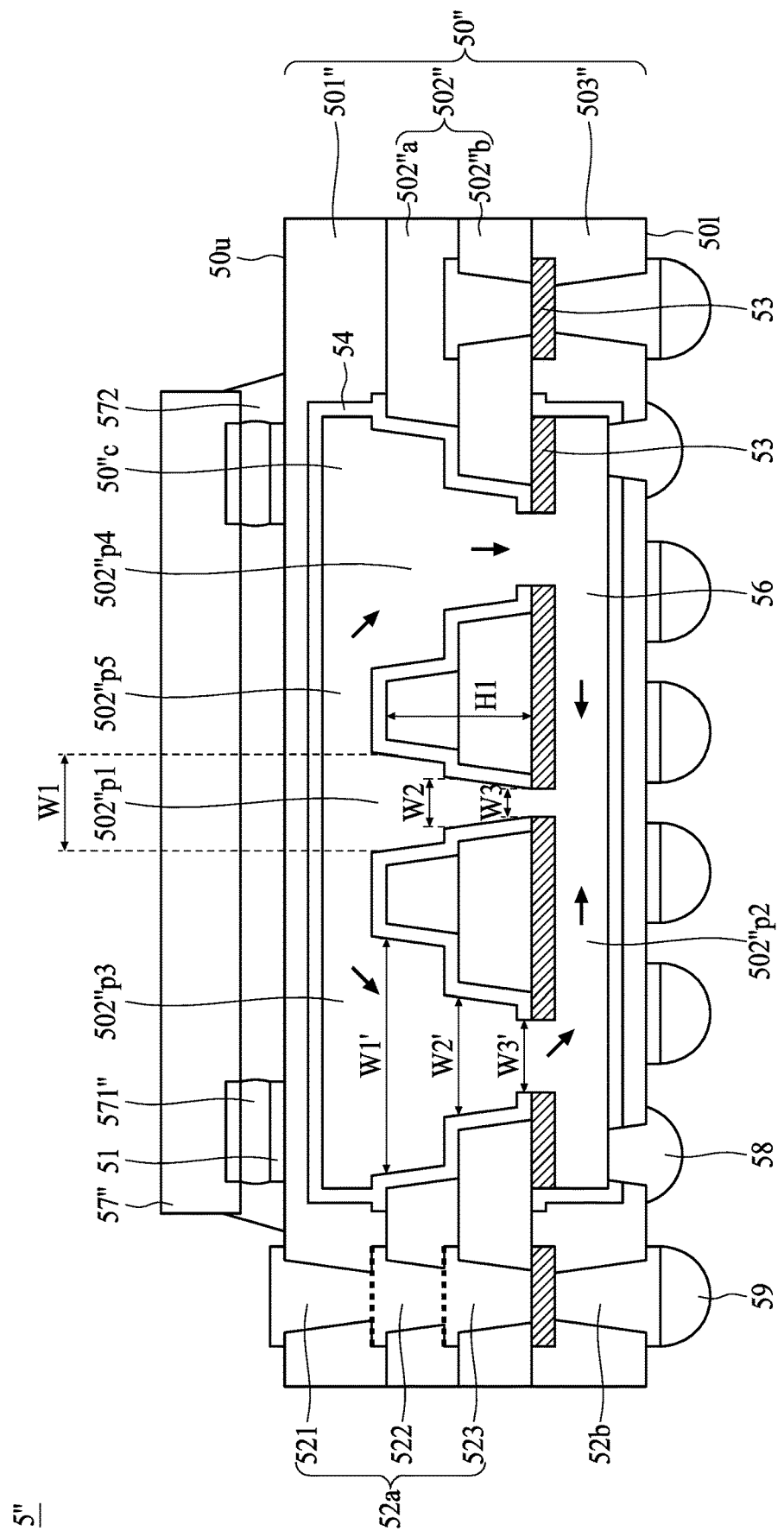
FIG. 5C illustrates a cross-sectional view of a semiconductor package structure according to some embodiments of the present disclosure.

FIG. 5C illustrates a cross-sectional view of a semiconductor package structure 5'' according to some embodiments of the present disclosure. The semiconductor package structure 5'' is similar to the structure of FIG. 2A except that the area, from a top view perspective, of either a passage portion 502''p3 or a passage portion 502''p4 is greater than the area, from a top view perspective, of a passage portion 502''p1. A width W1' of the passage portion 502''p3 is greater than a width W1 of the passage portion 502''p1. A width W2' of the passage portion 502''p3 is greater than a width W2 of the passage portion 502''p1. A width W3' of the passage portion 502''p3 is greater than a width W3 of the passage portion 502''p1.

The semiconductor device 57'' includes a conductive bump 571''. The conductive bump 571'' is surrounded by the underfill 572. The semiconductor device 57'' drives two circulation cycles in a cavity 50''C, respectively. The two circulation cycles in the cavity 50C may enhance heat dissipation. In some embodiments, the heat sources of the semiconductor device 57'' locate over the wider passage portions 502″p3 and 502″p4. As previously addressed, the location of the passage portion or passage portions with greater width can be adapted for the location of the heat sources on the semiconductor device 57″.

Figure 6B:
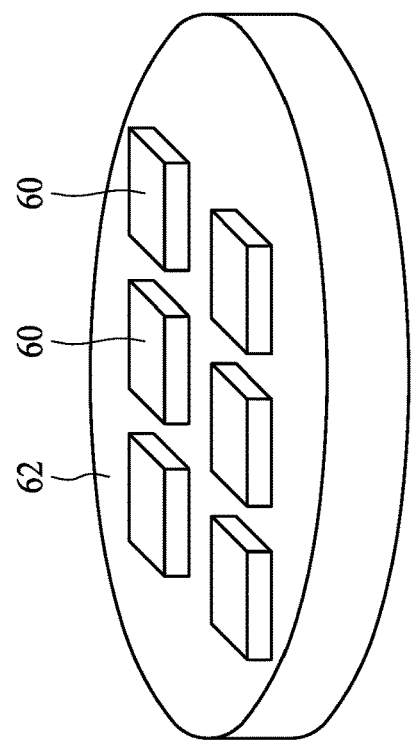
FIG. 6B illustrates a type of a carrier for semiconductor package structures in accordance with some embodiments of the present disclosure.
Figure 6A:
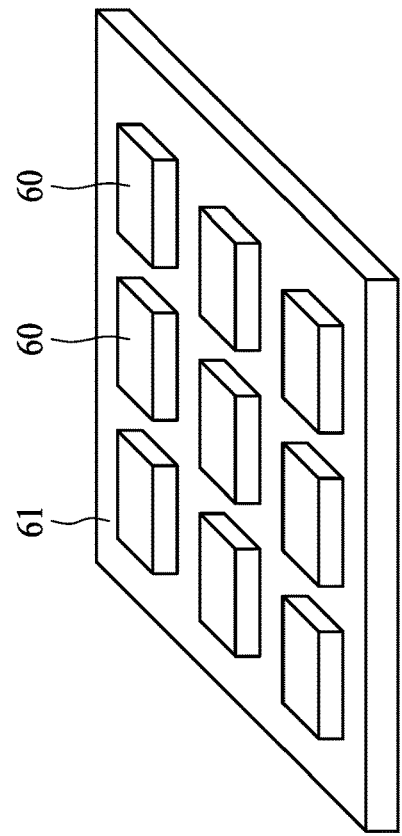
FIG. 6A illustrates a type of a carrier for semiconductor package structures in accordance with some embodiments of the present disclosure.

FIG. 6A shows a type of a carrier for semiconductor package structures in accordance with some embodiments of the present disclosure.

As shown in FIG. 6A, a plurality of semiconductor devices 60 or dies are placed on a substantially square-shaped carrier 61 (e.g. in accordance with one or more embodiments described herein). In some embodiments, the carrier 61 may include organic materials (e.g., a molding compound, BT, a PI, PBO, a solder resist, an ABF, a polypropylene (PP) or an epoxy-based material) and/or inorganic materials (e.g., silicon, glass, ceramic or quartz).

FIG. 6B shows another type of a carrier for semiconductor package structures in accordance with some embodiments of the present disclosure.

As shown in FIG. 6B, a plurality of semiconductor devices 60 or dies are placed on a substantially circle-shaped carrier 62 (e.g. in accordance with one or more embodiments described herein). In some embodiments, the carrier 62 may include organic materials (e.g., a molding compound, BT, a PI, PBO, a solder resist, an ABF, a PP or an epoxy-based material) and/or inorganic materials (e.g., silicon, glass, ceramic or quartz).

Figure 7A:
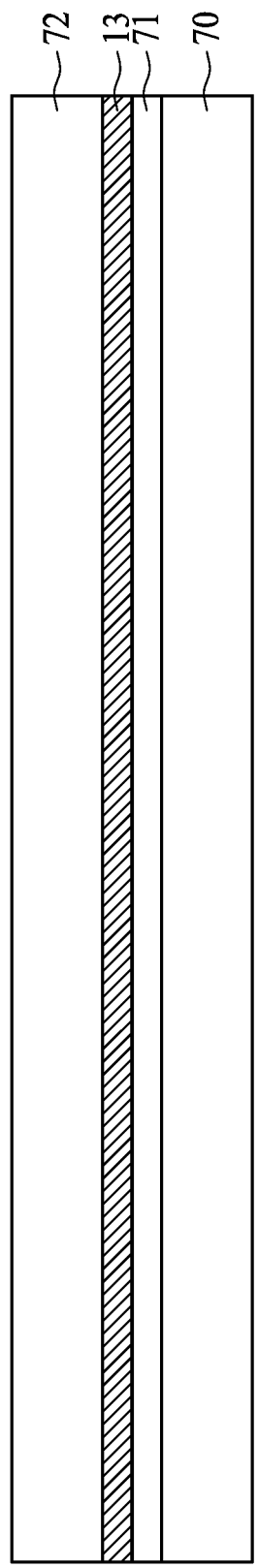
FIG. 7A, FIG. 7B, FIG. 7C, FIG. 7D, FIG. 7E, FIG. 7F, FIG. 7G, FIG. 7H, FIG. 7I, FIG. 7J, FIG. 7K, FIG. 7L, FIG. 7M, FIG. 7N, FIG. 7O, FIG. 7P, FIG. 7Q, FIG. 7R, FIG. 7S, FIG. 7T, FIG. 7U, FIG. 7V, FIG. 7W, FIG. 7X, and FIG. 7Y illustrates cross-sectional views of a semiconductor package structure during various intermediate manufacturing operations, in accordance to some embodiments of the present disclosure.
Figure 7B:
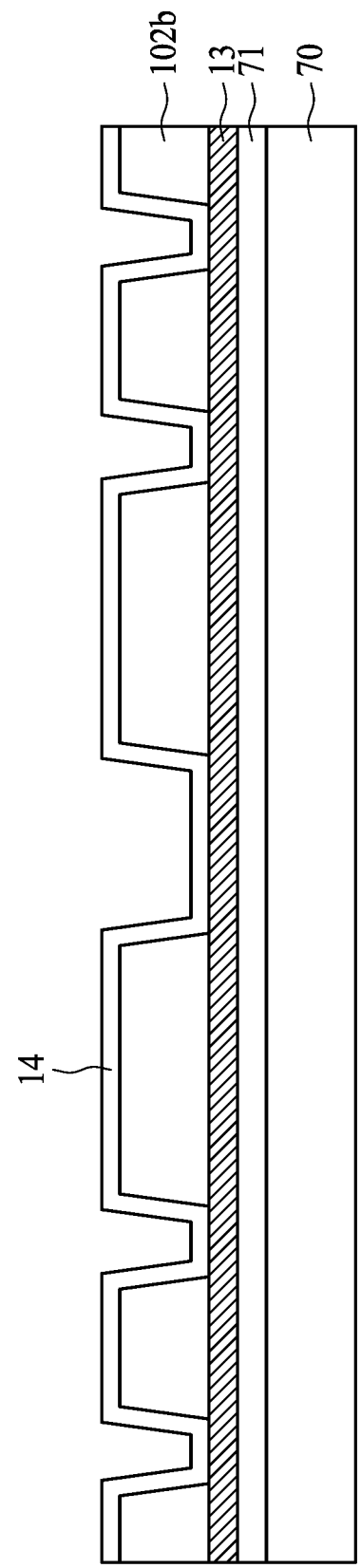
Figure 7C:
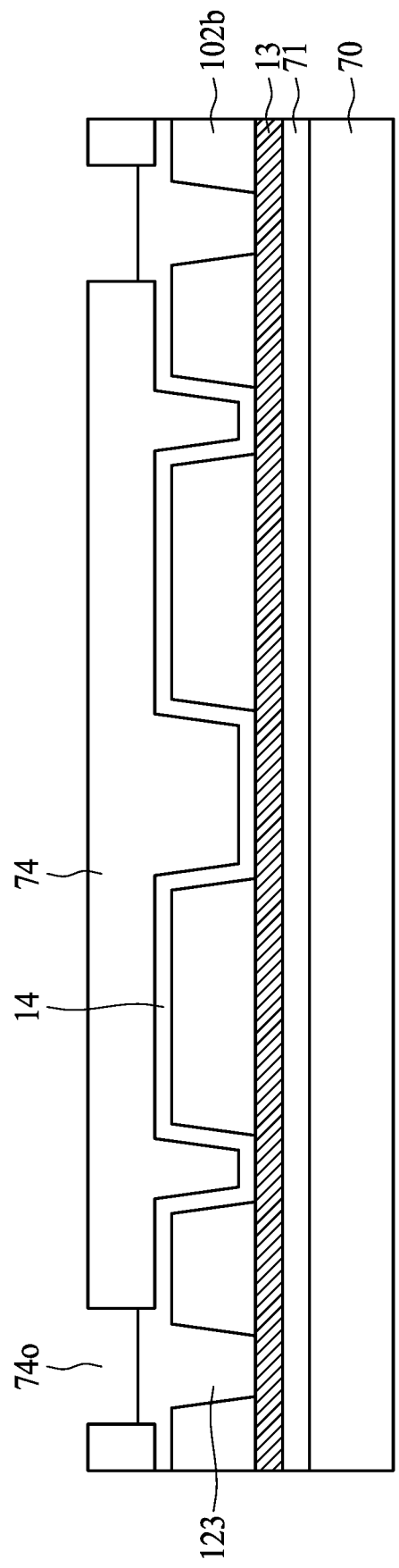
Figure 7D:
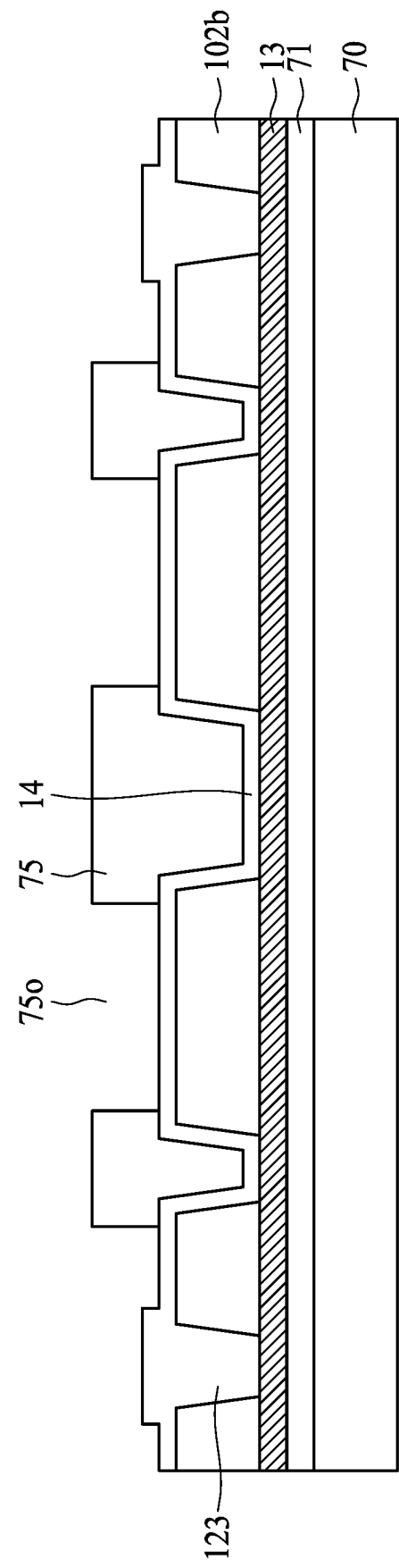
Figure 7E:
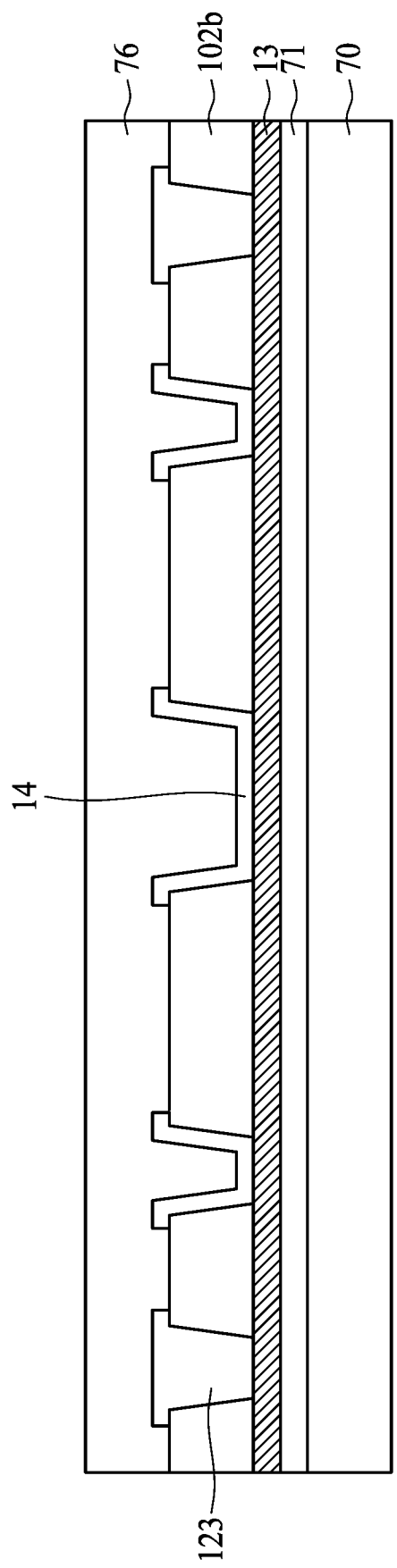
Figure 7F:
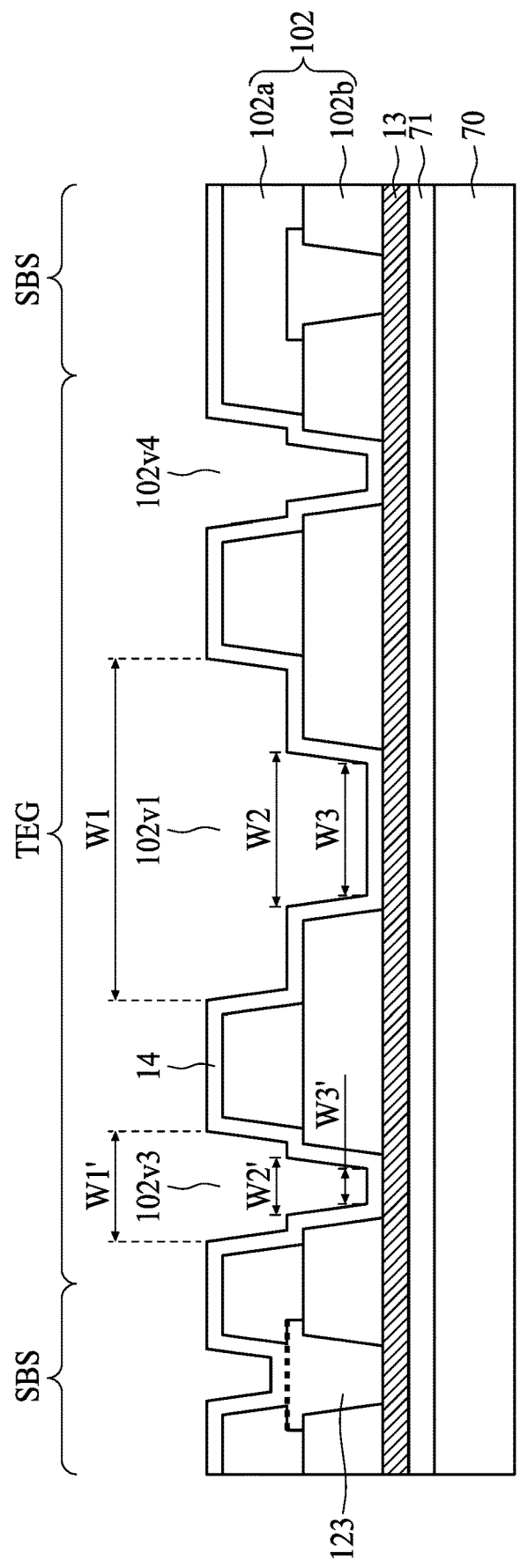
Figure 7G:
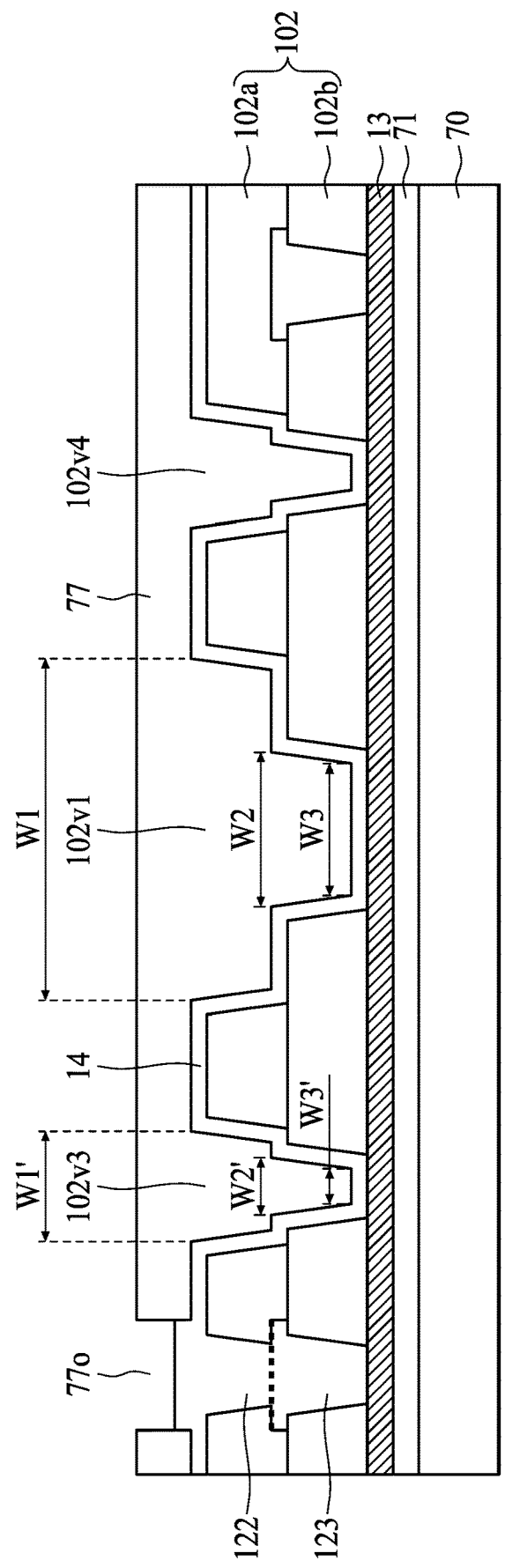
Figure 7H:
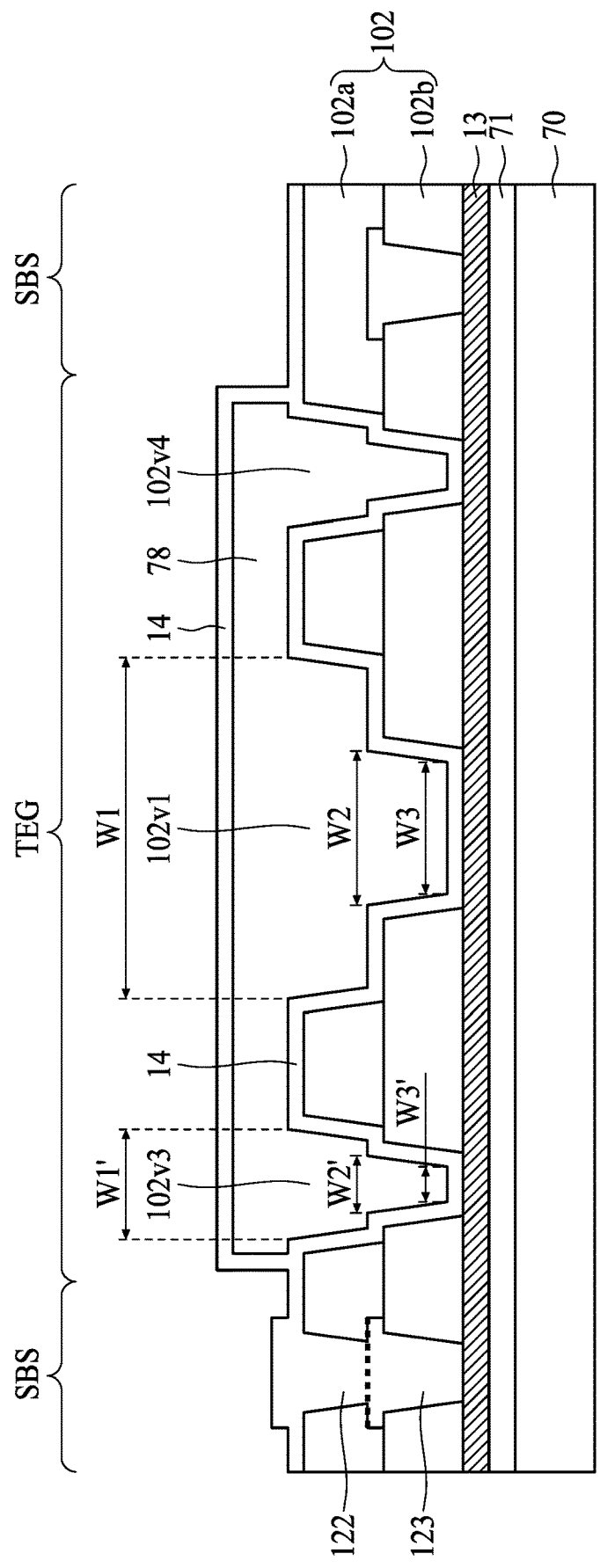
Figure 7I:
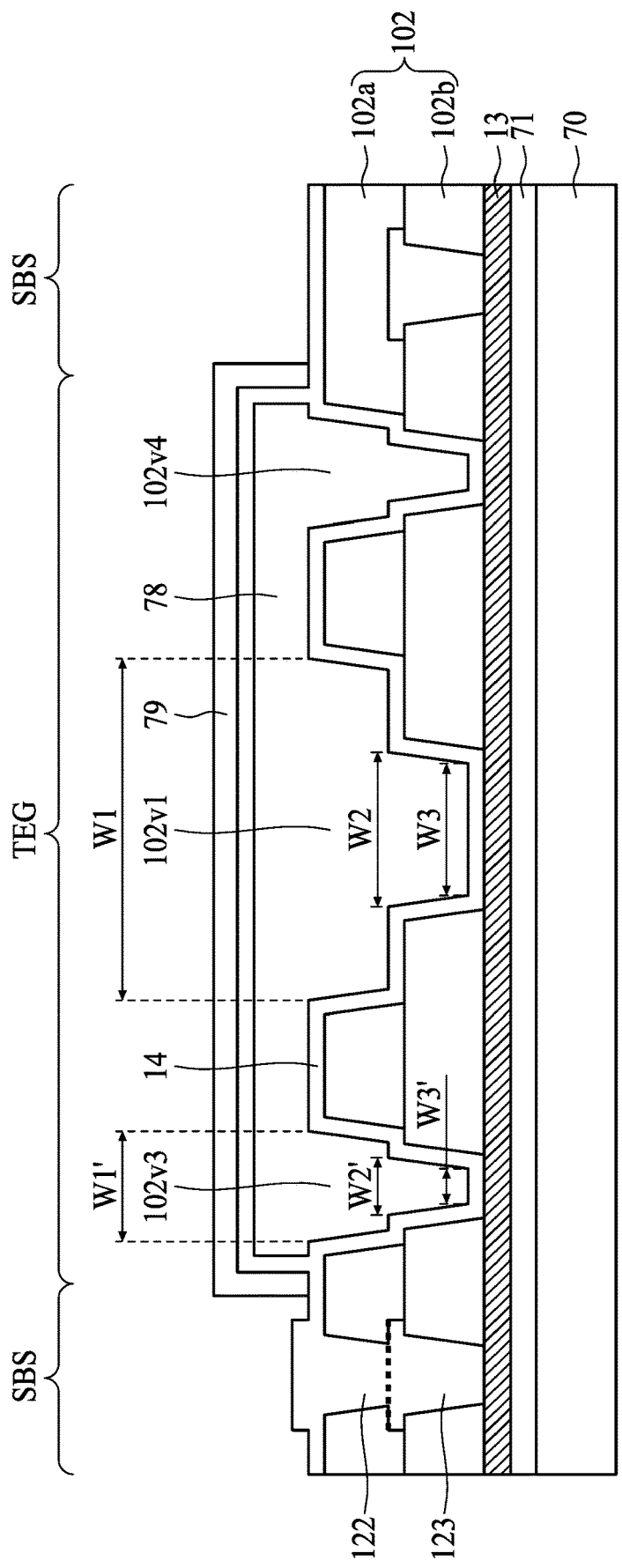
Figure 7J:
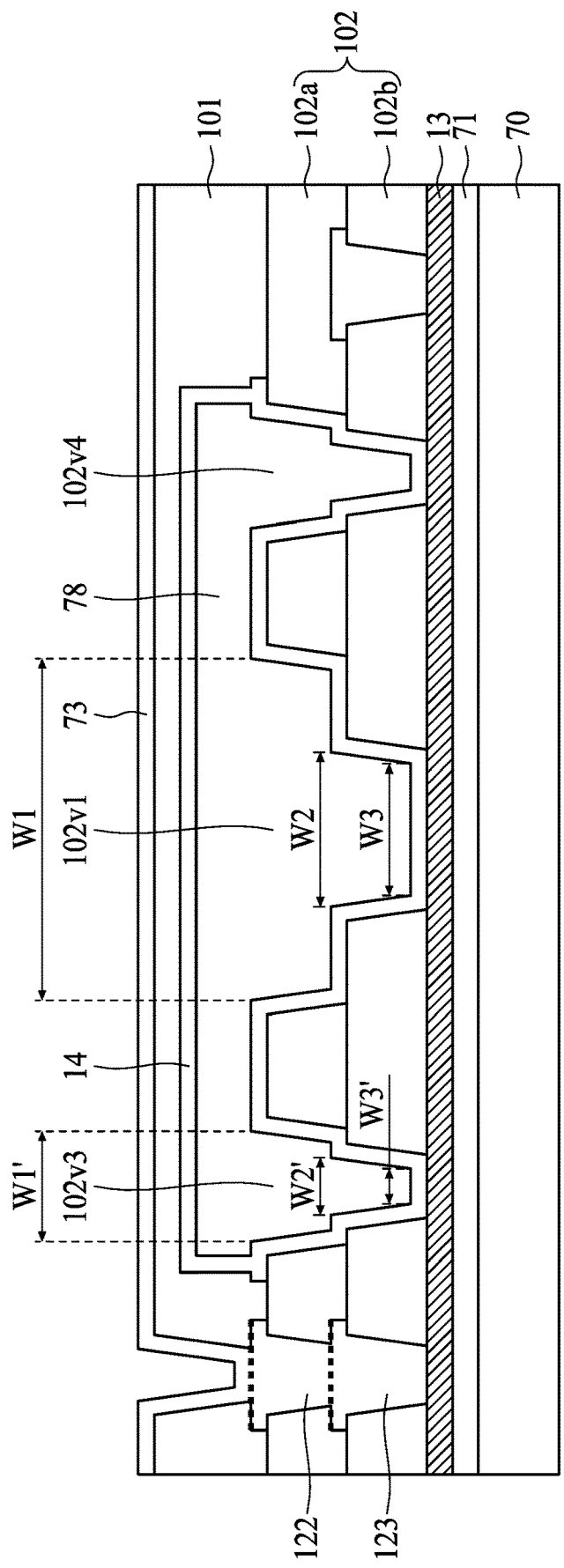
Figure 7K:
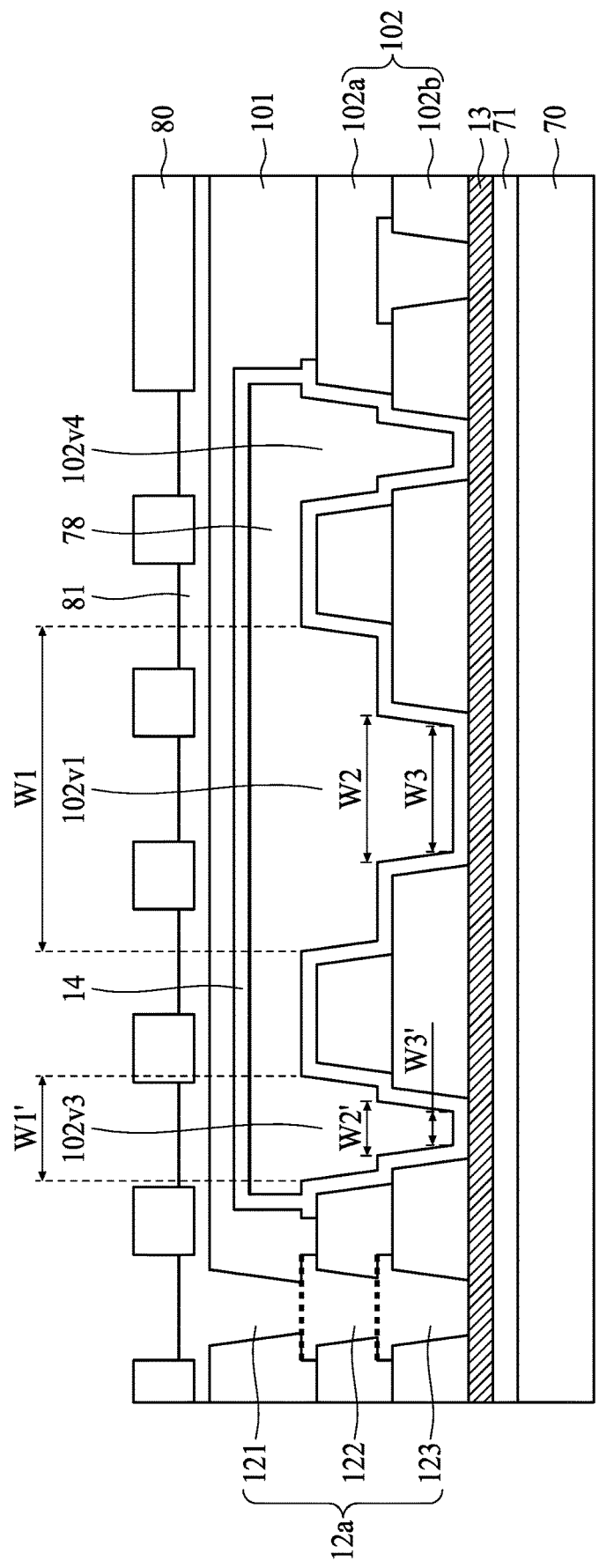
Figure 7L:
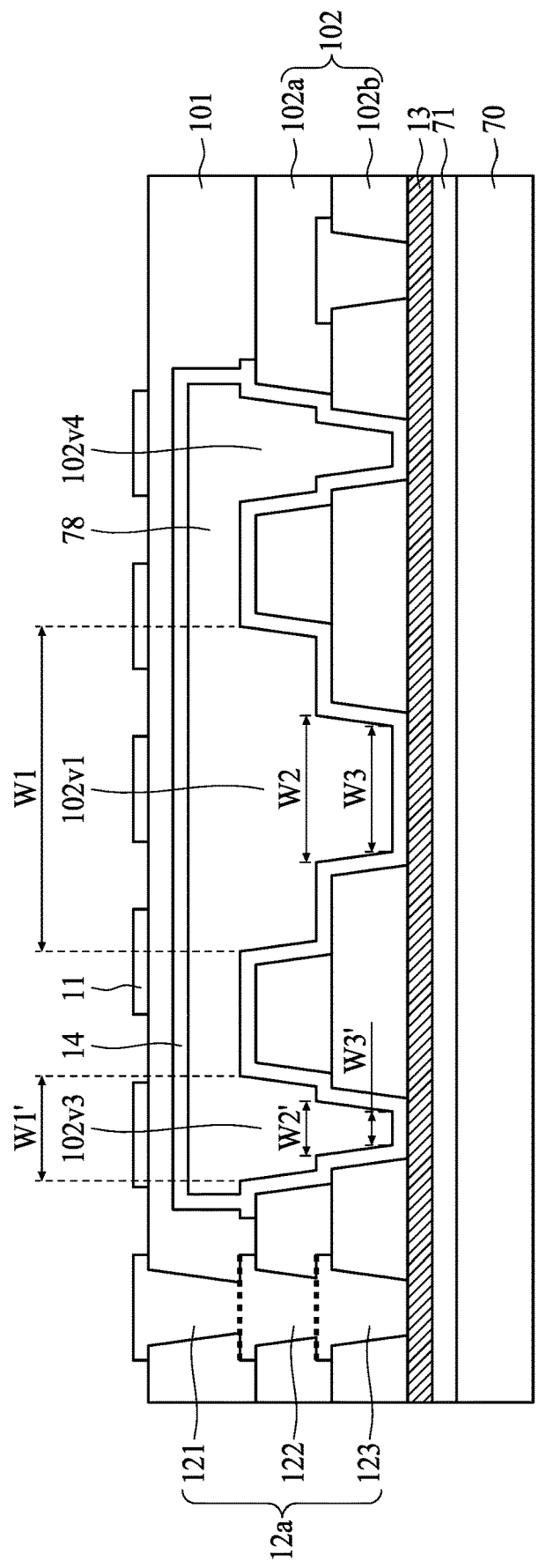
Figure 7M:
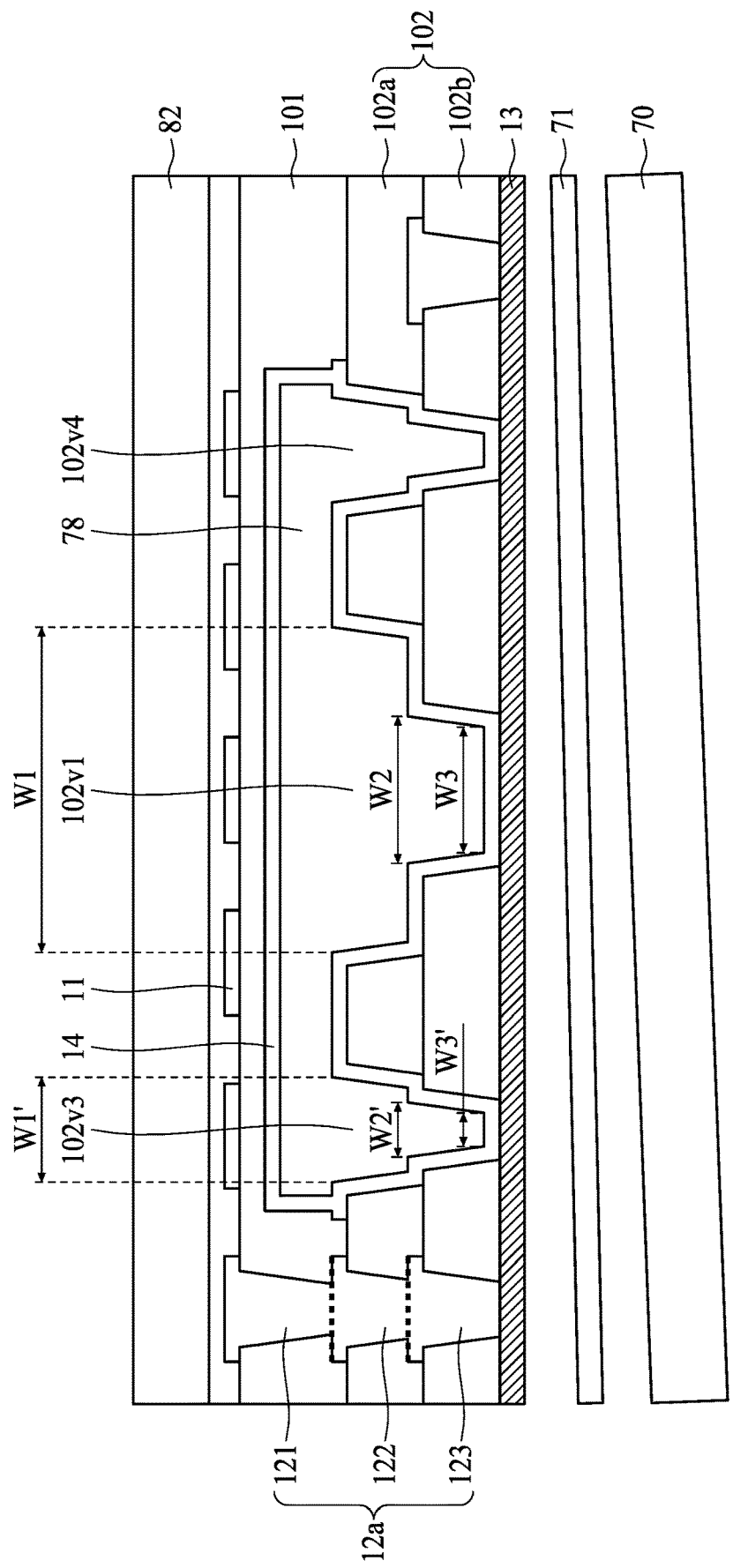
Figure 7N:
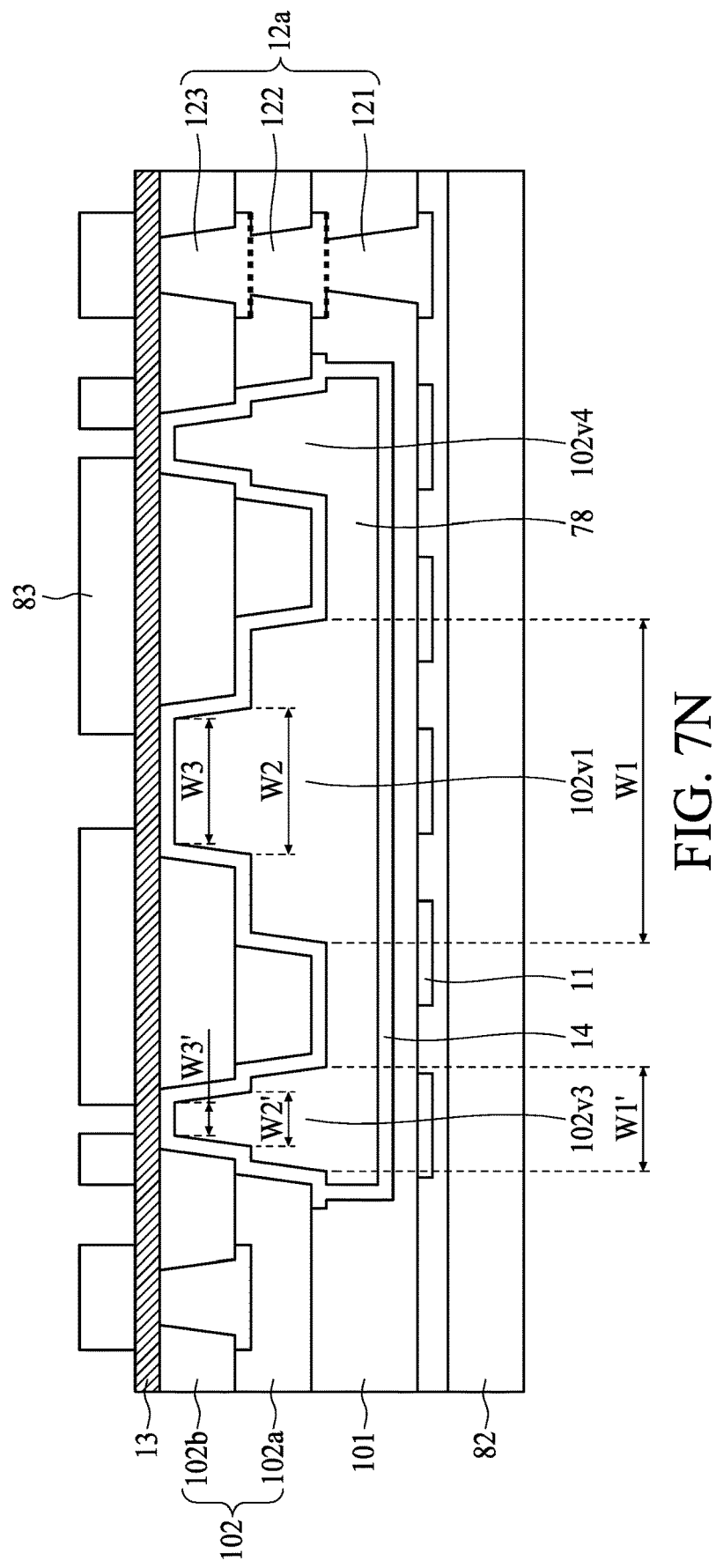
Figure 7O:
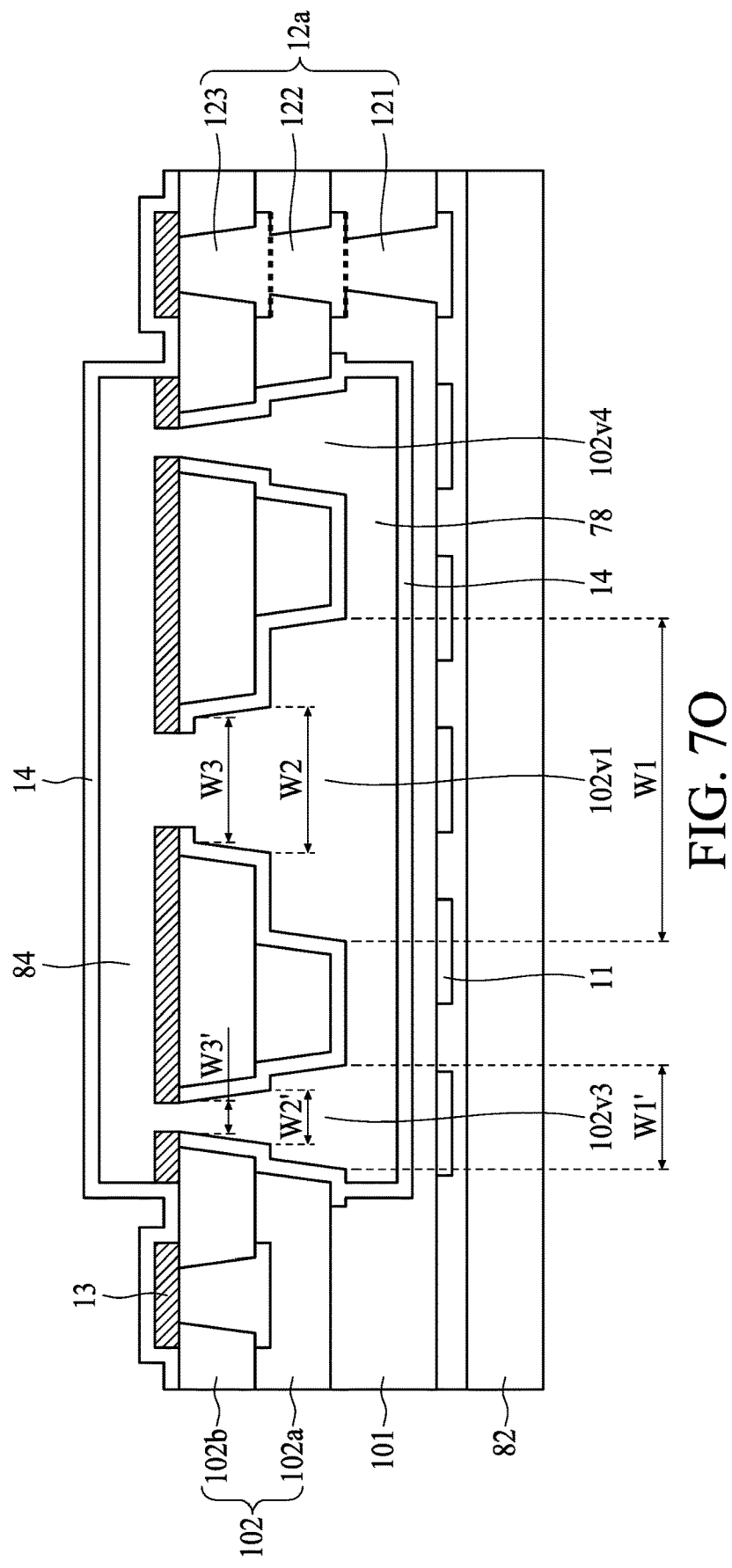
Figure 7P:
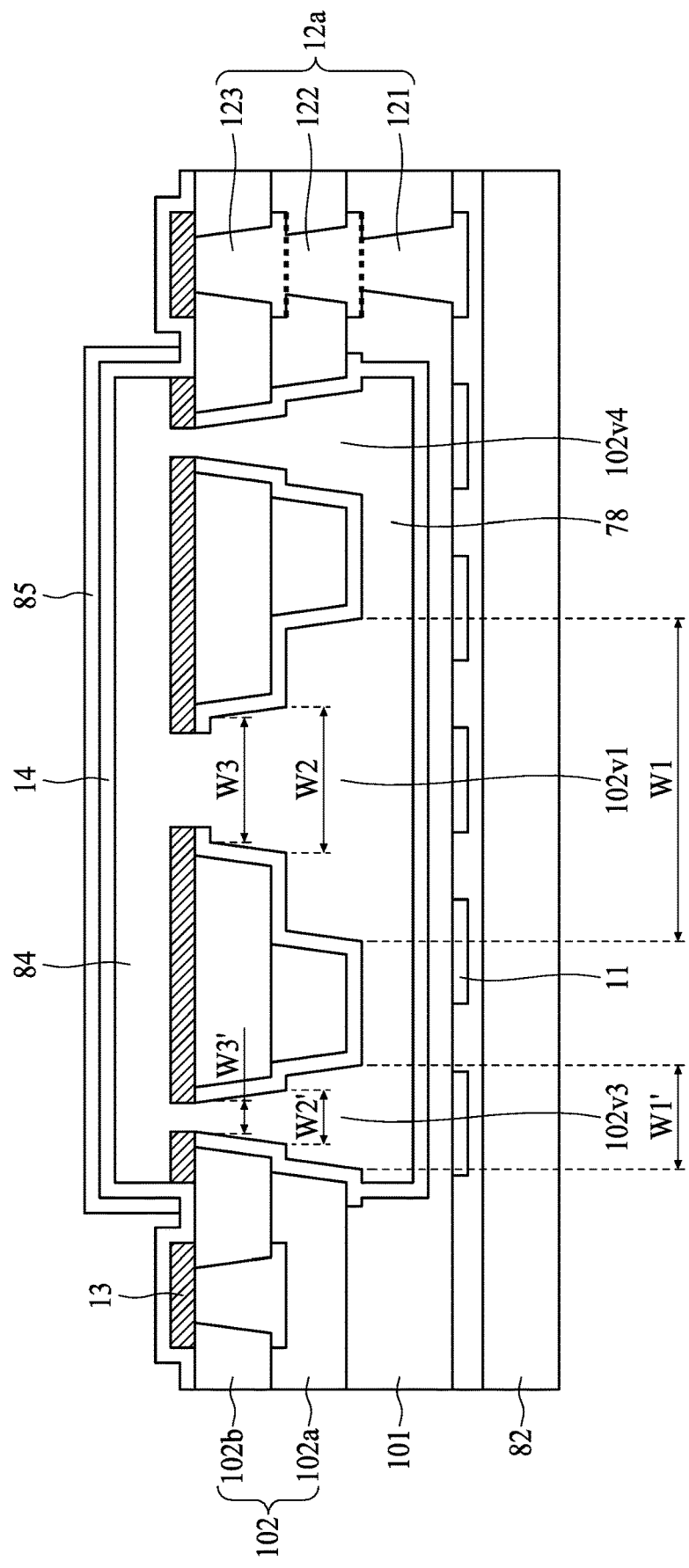
Figure 7Q:
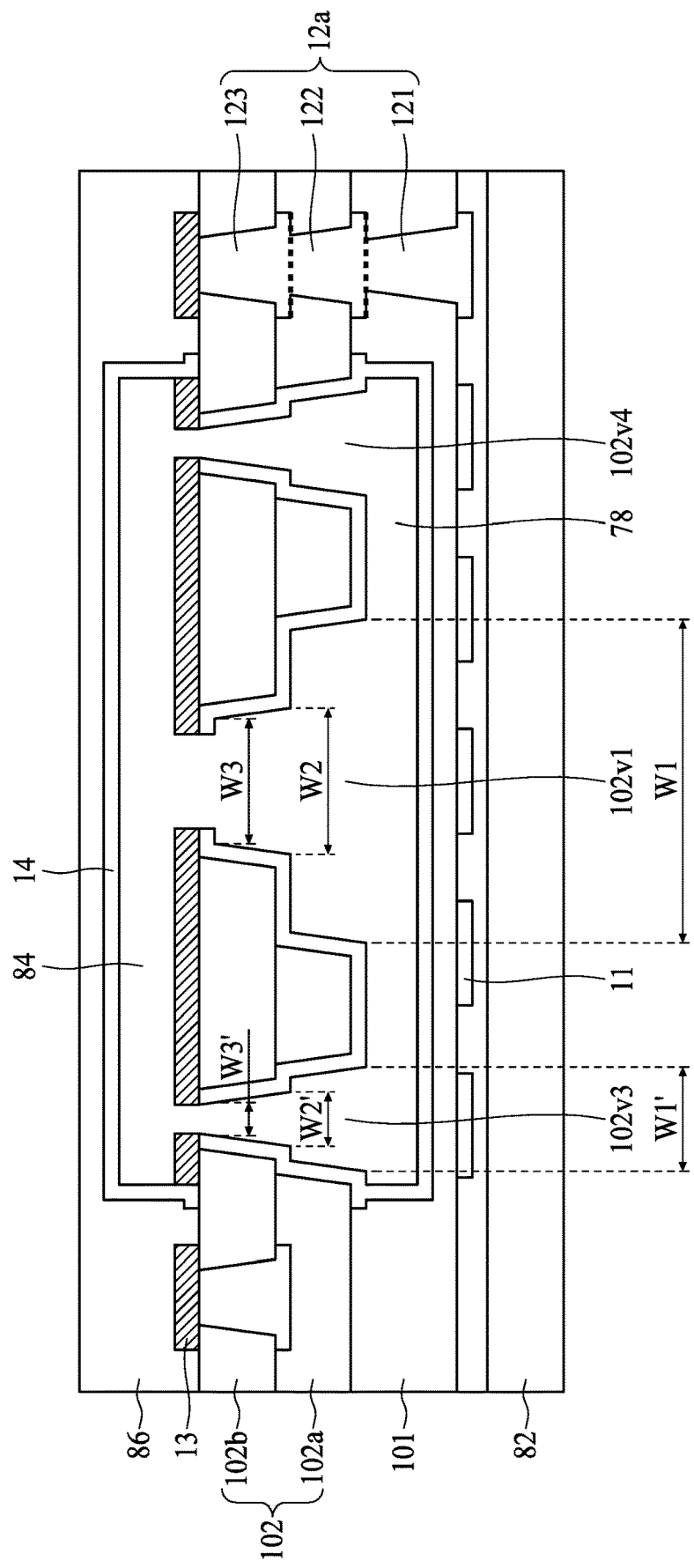
Figure 7R:
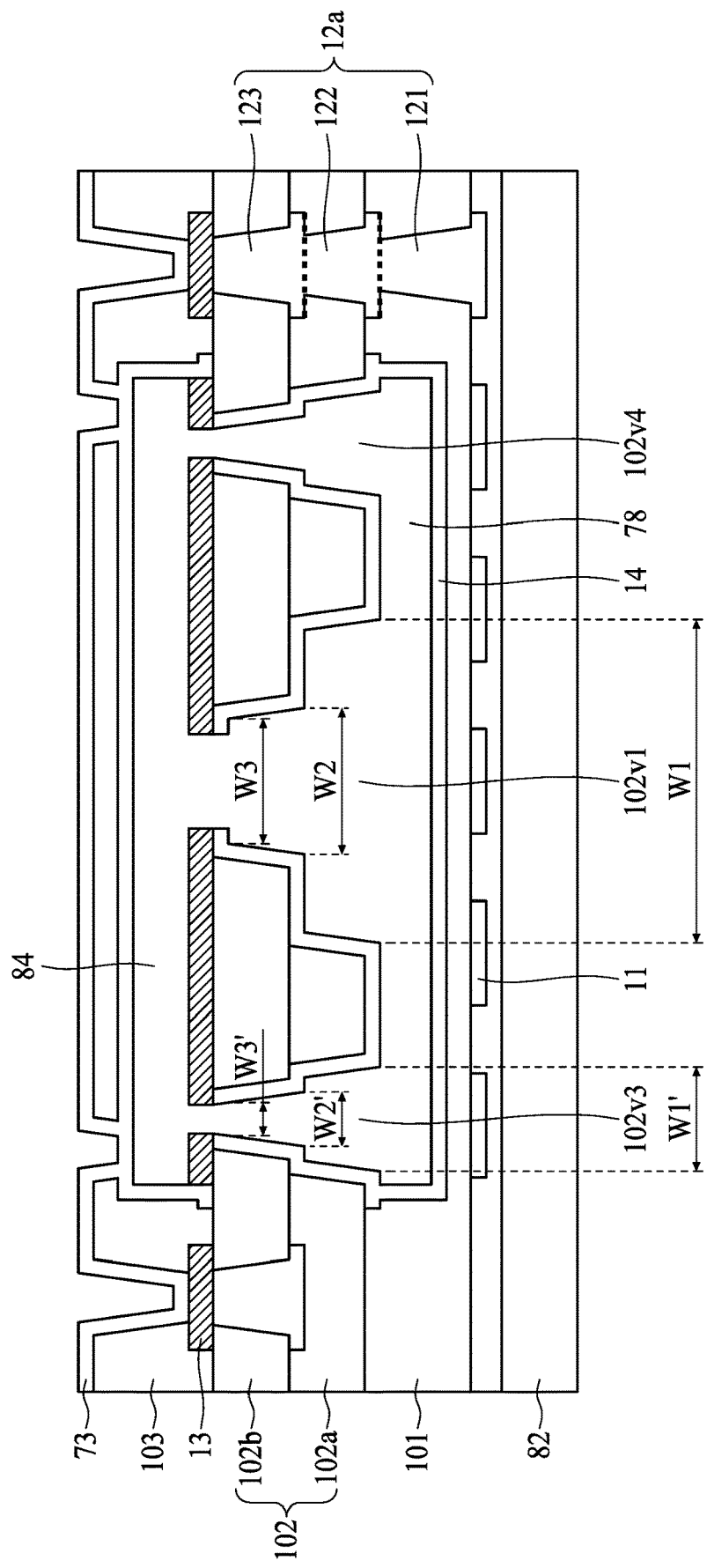
Figure 7S:
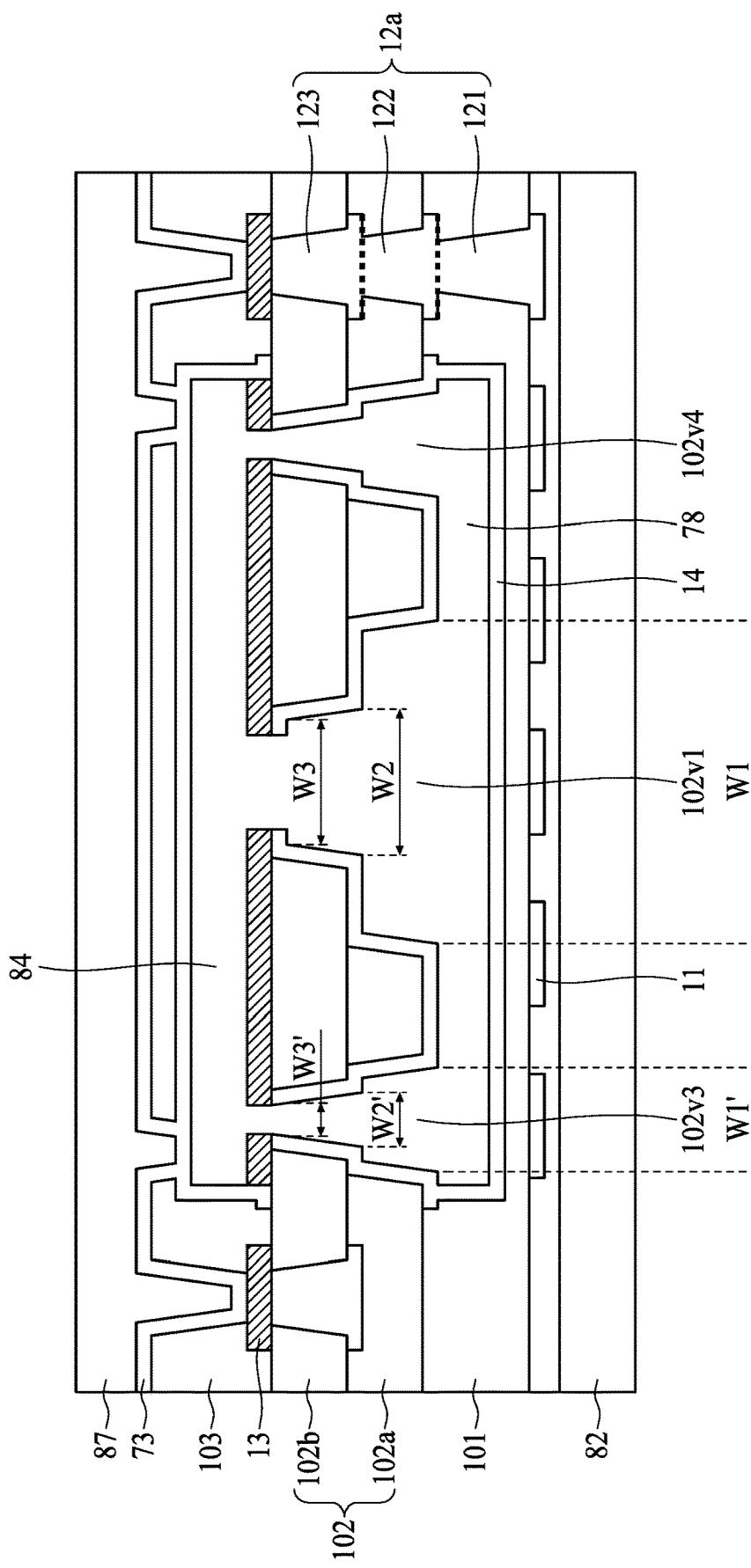
Figure 7T:
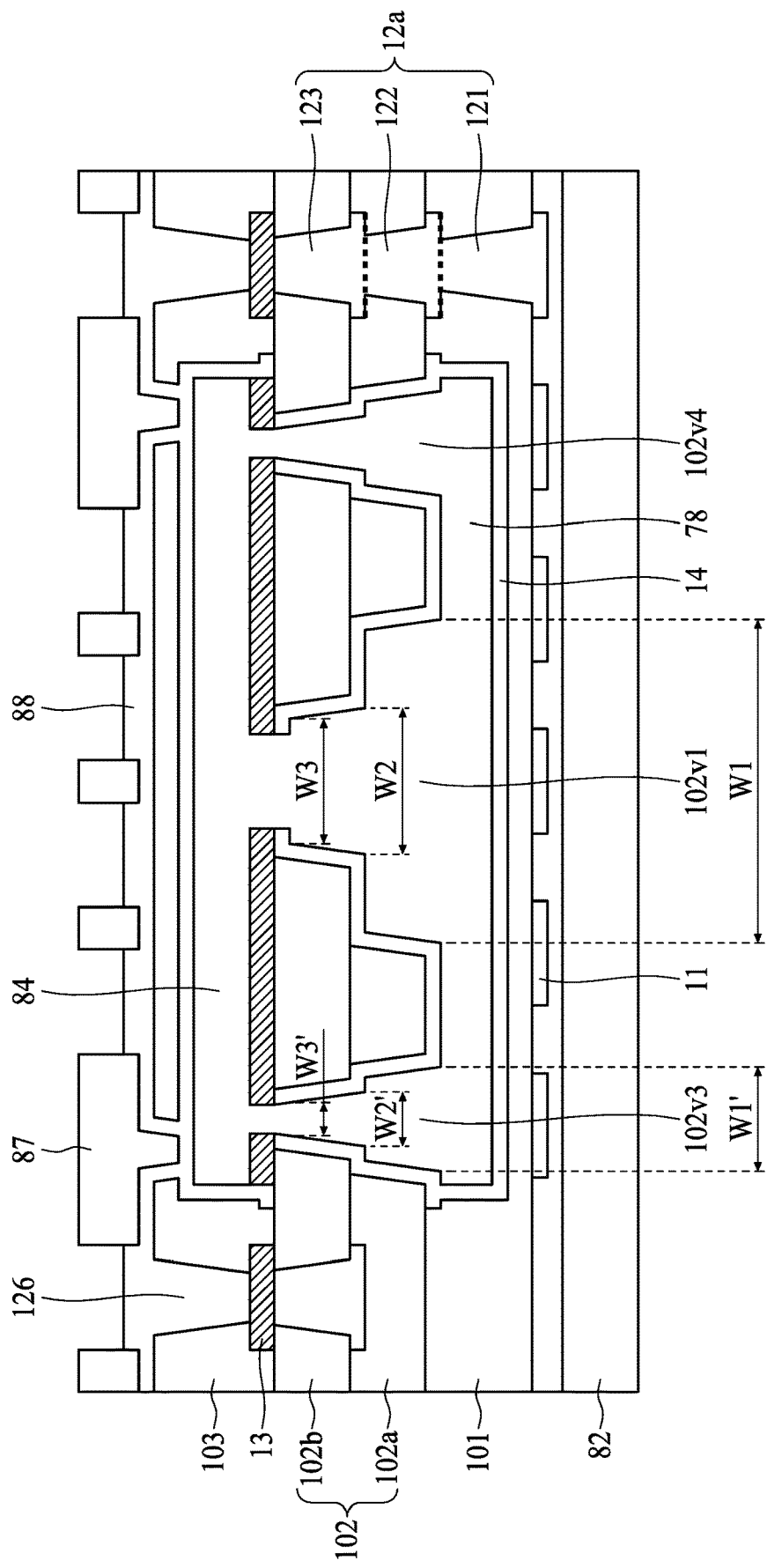
Figure 7U:
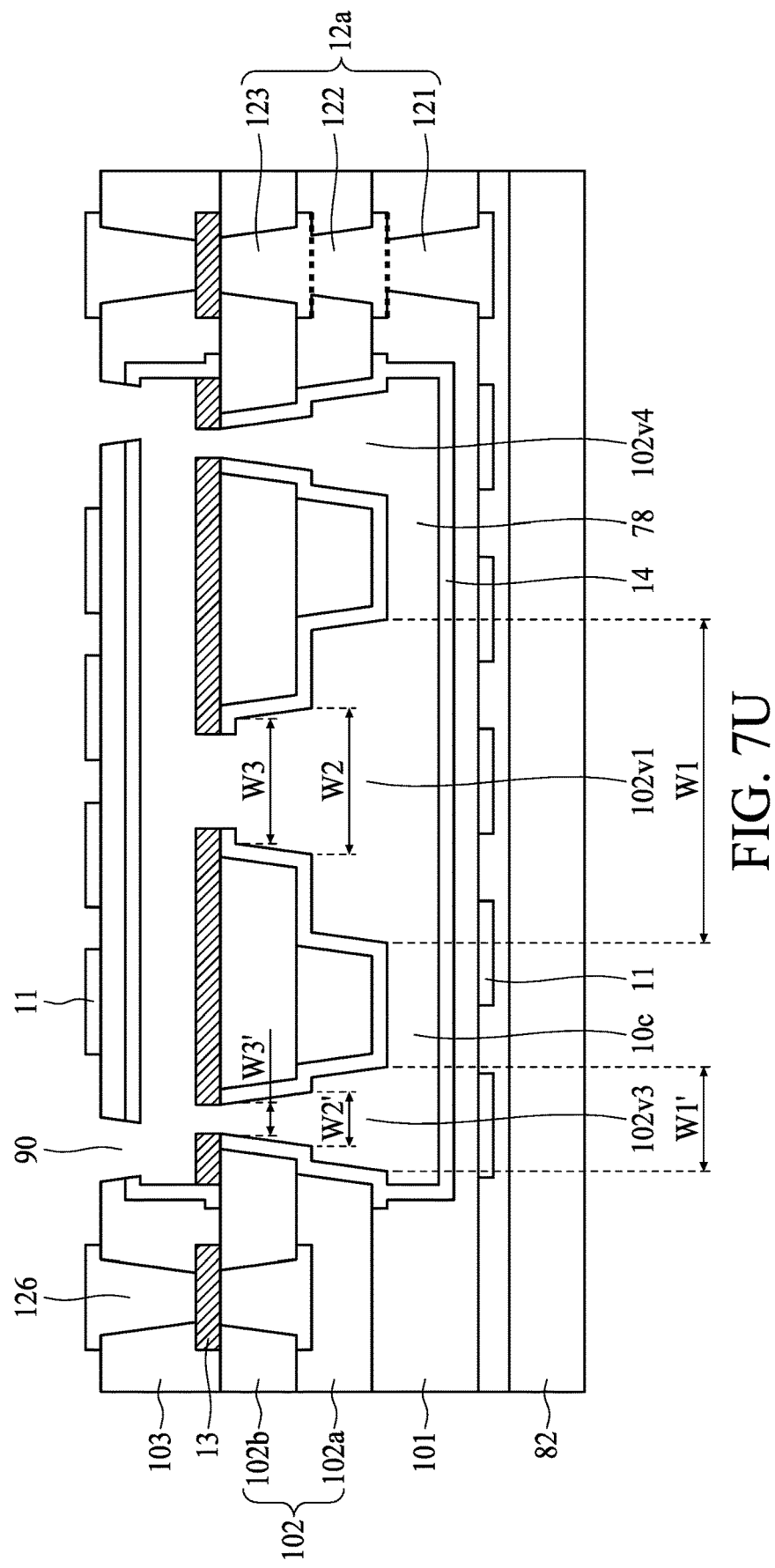
Figure 7V:
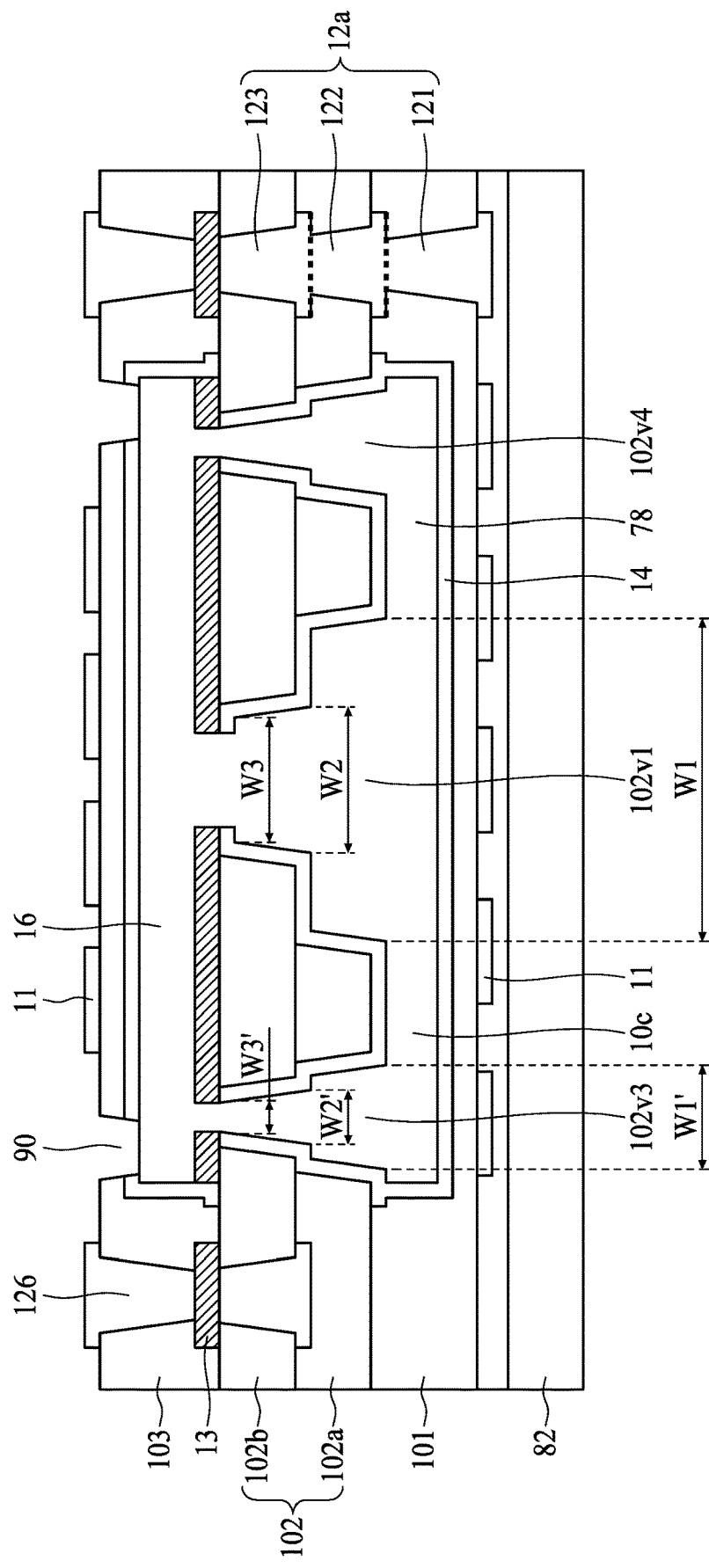
Figure 7W:
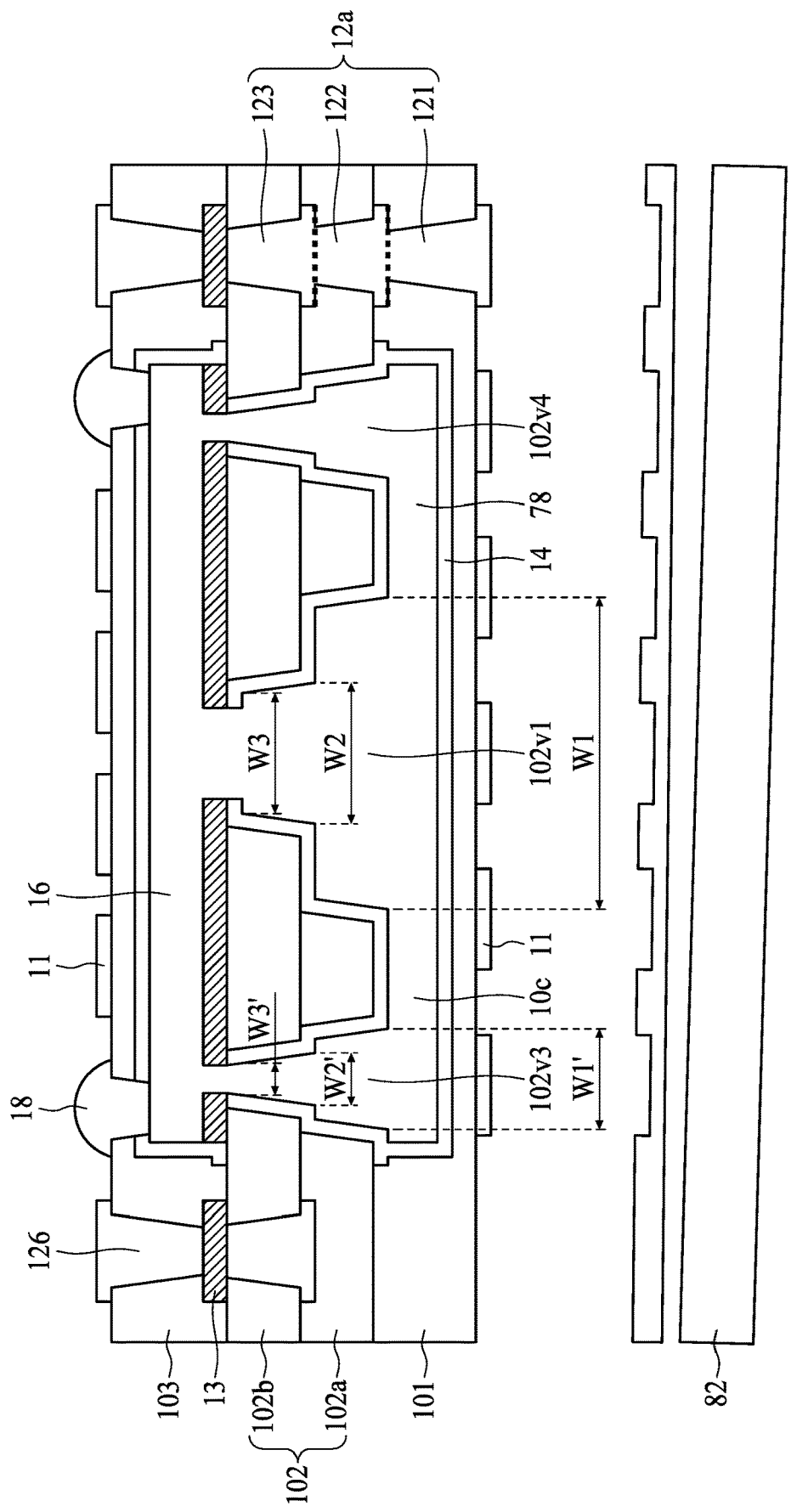
Figure 7X:
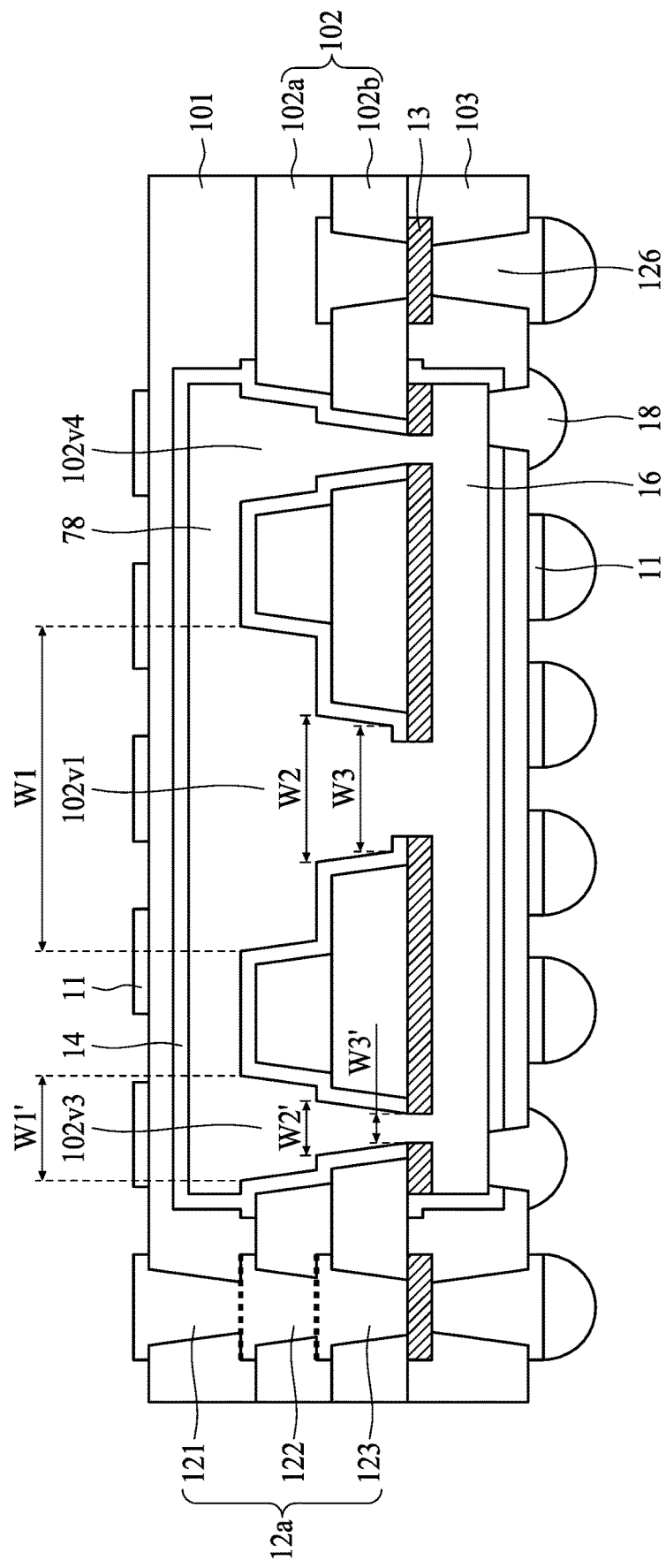
Figure 7Y:
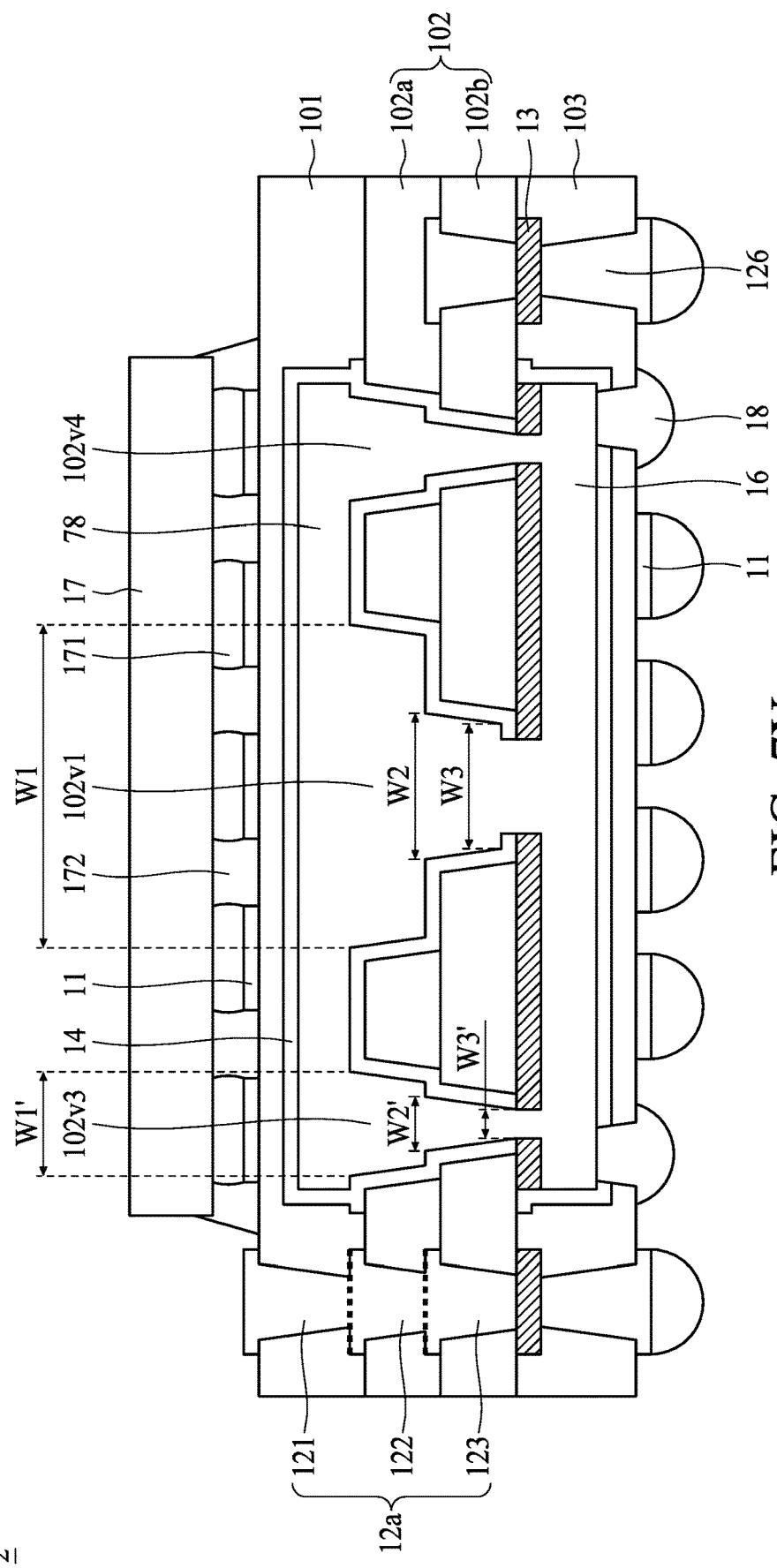

FIG. 7A through FIG. 7Y illustrate cross-sectional views of a semiconductor device package 2 during various intermediate manufacturing operations, according to some embodiments of the present disclosure.

Referring to FIG. 7A, a method for manufacturing the semiconductor device package 2 includes providing a carrier 70 with an adhesive 71. A base layer 13 is formed on the adhesive 71. A dielectric layer 72 is formed on the base layer 13. The base layer 13 is a conductive layer. The base layer 13 may include Ti, Cu, an alloy (e.g. Ti/Cu), or other suitable materials.

The dielectric layer 72 may be a passivation layer. The dielectric layer 72 may include a photosensitive material. The dielectric layer 72 may be coated on the base layer 13. The dielectric layer 72 may be laminated on the base layer 13. The dielectric layer 72 may be molded on the base layer 13.

Referring to FIG. 7B, the dielectric layer 72 of FIG. 7A is patterned during a lithographic operation. The dielectric layer 72 is patterned through exposure and development of a photomask thereover during the lithographic operation to form a patterned dielectric layer 102b. A conductive layer 14 is conformably deposited over the patterned dielectric layer 102b. The conductive layer 14 may be a seed layer. The conductive layer 14 may include Ti, Cu, an alloy (e.g. Ti/Cu), or other suitable materials.

Referring to FIG. 7C, a photoresist layer 74 is provided on the conductive layer 73. The photoresist layer 74 is patterned to form an opening 74o partially exposing the conductive layer 14. Subsequently, a plating operation is performed to form an interconnection conductive structure 123 in the opening. The interconnection conductive structure 123 is electrically connected to the base layer 13 and in direct contact with the conductive layer 14 or the seed layer. In some embodiments, the interconnection conductive structure 123 is in direct contact with the base layer 13.

Referring to FIG. 7D, after the photoresist layer 74 of FIG. 7C is removed, a photoresist layer 75 is formed on the conductive layer 14 and the interconnection conductive structure 123. Subsequently, the photoresist layer 75 is patterned to form an opening 75o partially exposing the conductive layer 14 and the interconnection conductive structure 123. Then, an etching operation is performed. An exposed portion of the conductive layer 14 is removed, as shown in FIG. 7E.

Referring to FIG. 7E, after the photoresist layer 75 of FIG. 7D is removed, a dielectric layer 76 is provided on the patterned dielectric layer 102b. The dielectric layer 76 may be a passivation layer or composed of polymeric materials. The dielectric layer 76 may include a photosensitive material. The dielectric layer 76 may be coated on the patterned dielectric layer 102b. The dielectric layer 76 may be laminated on the patterned dielectric layer 102b. The dielectric layer 76 may be molded on the patterned dielectric layer 102b.

Referring to FIG. 7F, the dielectric layer 76 is patterned through exposure and development of a photomask thereover during the lithographic operation to form a patterned dielectric layer 102a. The patterned dielectric layer 102a and the patterned dielectric layer 102b together form a dielectric structure/layer 102. Conductive material is formed over the patterned dielectric layer 102a and the patterned dielectric layer 102b so as to form a continuous conductive layer 14, as shown in FIG. 7F. Although not illustrated in FIG. 7F, the continuous conductive layer 14 may have various thicknesses in different portions. For example, the portion of the conductive layer 14 conforming to the opening of the patterned dielectric layer 102b may be thicker than the portion of the conductive layer 14 conforming to the opening of the patterned dielectric layer 102a because the portion of the conductive layer 14 conforming to the opening of the patterned dielectric layer 102b has been through at least two conductive material deposition operations, as previously described in FIG. 7B and FIG. 7F.

The dielectric structure 102 has a thermal enhanced generator (TEG) region and a substrate region adjacent to the TEG region. The TEG region is configured to receive a heat source. The dielectric structure 102 has a via trench 102v1. The via trench 102v1 is so formed to correspond to the passage portion 102p1 as illustrated in FIG. 1A. The dielectric structure 102 has a via trench 102v3. The via trench 102v3 is so formed to correspond to the passage portion 102p3 as illustrated in FIG. 1A. The dielectric structure 102 has a via trench 102v4. The via trench 102v4 is so formed to correspond to the passage portion 102p4 as illustrated in FIG. 1A. The structure of the via trench 102v4 may be similar to that of the via trench 102v3. The via trench 102v1 may have a tapered profile or a step profile. The via trench 102v3 may have a tapered profile or a step profile. The via trench 102v1 has an opening with various widths at different positions of the trench, for example, a width W1, a width W2, and a width W3. The width W1 is greater than the width W2. The width W2 is greater than the width W3. The via trench 102v3 has an opening with various widths at different positions of the trench, for example, a width W1′, a width W2′, and a width W3′. The width W1′ is greater than the width W2′. The width W2′ is greater than the width W3′. The size or openings of the via trench 102v1 or trench 102v3 may be adjusted by the lithographic operations.

Referring to FIG. 7G, a photoresist layer 77 is provided on the dielectric structure 102. The photoresist layer 77 is patterned to form an opening 77o by a lithographic operation. A plating operation is performed to form an interconnection conductive structure 122 in the opening. The interconnection conductive structure 122 is electrically connected to the interconnection conductive structure 123 and in direct contact with the conductive layer 14 or the seed layer formed in FIG. 7F. The photoresist layer 77 can be removed after the plating operation.

Referring to FIG. 7H, a photoresist layer 78 is provided over the dielectric structure 102. The photoresist layer 78 may be a sacrificial layer, which is capable of occupying a space and subsequently removed to free said space in suitable operations. The photoresist layer 78 is patterned to expose the SBS region by a lithographic operation. The photoresist layer 78 covers the TEG region. A conductive layer 14 is formed over the dielectric structure 102 and the patterned photoresist layer 78.

Referring to FIG. 7I, a photoresist layer 79 is provided over the dielectric structure 102, the photoresist layer 78, and the conductive layer 14 formed in FIG. 7H. The photoresist layer 79 is patterned to expose the substrate region by a lithographic operation. Patterned photoresist layer 79 can be utilized to pattern the conductive layer 14 over the dielectric layer 102$a$, as will be addressed in FIG. 7J.

Referring to FIG. 7J, a portion of the conductive layer 14 not covered by the photoresist layer 79 is removed by an etching operation. In some embodiments, the conductive layer 14 is separated and electrically isolated from the interconnection conductive structure 122 and the interconnection conductive structure 123. In other non-illustrated embodiments, the conductive layer 14 can be electrically connected to the interconnect structure 122 and the interconnect structure 123 and thereby being grounded. In some embodiments, the conductive layer 14 may act as a thermal-conduction path. In some embodiments, the conductive layer 14 may act as an isolation layer to prevent the dielectric structure 102 from eroding by corrosive fluid subsequently filling in to the space currently occupied by the photoresist layer 78 or the sacrificial layer.

After patterning the conductive layer 14, the photoresist layer 79 is removed. A dielectric layer 101 is provided on the dielectric structure 102, the photoresist layer 78 or the sacrificial layer, and the conductive layer 14. The dielectric layer 101 may be a passivation layer. The dielectric layer 101 may include a photosensitive material. The dielectric layer 101 may be coated on the dielectric structure 102. The dielectric layer 101 may be laminated on the dielectric structure 102. The dielectric layer 101 may be molded on the dielectric structure 102.

The dielectric layer 101 is patterned to form an opening 101$o$ exposing the interconnect structure 122. A conductive layer 73 is formed over the dielectric layer 101 and the opening 101$o$. The conductive layer 73 may be a seed layer. The conductive layer 73 may include Ti, Cu, an alloy (e.g. Ti/Cu), or other suitable materials.

Referring to FIG. 7K, a photoresist layer 80 is provided over the dielectric layer 101 and the conductive layer 73. The photoresist layer 80 is patterned by a lithographic operation to form multiple openings. A plating operation is subsequently performed to form an interconnection conductive structure 121 and a conductive layer 81 directly contacting the underlying conductive layer 73. Alternatively stated, the conductive layer 73 and the conductive layer 81 form a continuous conductive layer. A boundary can be observed between the conductive layer 73, or the seed layer, and the conductive layer 81, or the plated layer.

Referring to FIG. 7L, the photoresist layer 80 of FIG. 7K is removed. Subsequently, an etching operation is performed to form a conductive pad 11. The conductive pad 11 is spaced from the interconnection conductive structure 121 with a distance.

Referring to FIG. 7M, a carrier 82 is bonded to the dielectric structure 10. The carrier 82 may be bonded to the dielectric structure 101 with an adhesive. The carrier 70 previously supporting the manufacturing operation and the adhesive 71 are then removed after the bonding of the carrier 82.

Referring to FIG. 7N, the intermediate semiconductor package structure is flipped upside down. A photoresist layer 83 is formed on the conductive layer 13. The photoresist layer 83 is patterned to form an opening by a lithographic operation. The conductive layer 13 and the conductive layer 14 are patterned through the patterned photoresist layer 83. The photoresist layer 83 is removed after the patterning of the conductive layer and the conductive layer 14.

Referring to FIG. 7O, a photoresist layer 84 is formed over the dielectric layer 102$b$ and the conductive layer 13. The photoresist layer 84 may be a sacrificial layer, which is capable of occupying a space and subsequently removed to free said space in suitable operations. The photoresist layer 84 is patterned to form an opening by a lithographic operation. The patterned photoresist layer 84 overlaps with the via trenches 102$v$1, 102$v$2, and 102$v$3, currently filled with a sacrificial layer. Subsequently, the conductive layer 14 is formed on the patterned photoresist layer 84, the conductive layer 13, and the dielectric layer 102$b$.

Referring to FIG. 7P, a photoresist layer 85 is formed on the conductive layer 73. The photoresist layer 85 is patterned by a lithographic operation. The patterned photoresist layer 85 covers the via trenches 102$v$1, 102$v$2, and 102$v$3, currently filled with a sacrificial layer. Patterned photoresist layer 85 can be utilized to pattern the conductive layer 14 over the dielectric layer 102$b$, as will be addressed in FIG. 7Q.

Referring to FIG. 7Q, a portion of the conductive layer 14 not covered by the photoresist layer 85 is removed by an etching operation. Subsequently, the patterned photoresist layer 85 is removed. A dielectric layer 86 is formed on the dielectric layer 102$b$. The dielectric layer 86 may be a passivation layer. The dielectric layer 86 may include a photosensitive material. The dielectric layer 86 may be coated on the dielectric layer 102$b$. The dielectric layer 86 may be laminated on the dielectric layer 102$b$. The dielectric layer 86 may be molded on the dielectric layer 102$b$.

Referring to FIG. 7R, the dielectric layer 86 of FIG. 7Q is patterned by a lithographic operation to form a dielectric layer 103 with an opening aligning with the interconnect structure 12$a$. Subsequently, a conductive layer 73 is formed on the patterned dielectric layer 103.

Referring to FIG. 7S, a photoresist layer 87 is formed on the conductive layer 73.

Referring to FIG. 7T, the photoresist layer 87 is patterned to form a plurality of openings by a lithographic operation. A conductive layer 88 is formed in the opening by a plating operation. An interconnection conductive structure 126 is formed in a trench structure exposed from the patterned photoresist layer 87 by a plating operation. The interconnection conductive structure 126 and a conductive layer 88 directly contacting the underlying conductive layer 73 or the seed layer. Alternatively stated, the conductive layer 88 and the conductive layer 73 form a continuous conductive layer. A boundary can be observed between the conductive layer 73, or the seed layer, and the conductive layer 88, or the plated layer.

Referring to FIG. 7U, the photoresist layer 87 is removed. Subsequently, an etching operation is performed to form an empty space by removing the photoresist layer 78 and 84 or the sacrificial layer as previously described. With further manufacturing operations described below, the empty space turns into the cavity 10C as shown in the semiconductor package structure 2 of FIG. 2A. The empty space has an opening 90 formed by a photolithography operation omitted in present disclosure.

Referring to FIG. 7V, a fluid 16 is introduced into the cavity 10C through the opening 90. The fluid 16 may completely fill or partially fill the cavity 10C. In some embodiments, the semiconductor trace structure includes a cavity 10C without being filled or partially filled by the fluid 16.

Referring to FIG. 7W, a sealing element 18 seals the opening 90 by a sealing operation. Referring back to FIG. 2D, the sealing element 18 can possess a rectangular shape enclosed by a principal or major dimension and a minor dimension from a top view perspective. The carrier 82 is then detached from the dielectric layer 191 and the interconnect structure 12a.

Referring to FIG. 7X, a connection element 19 is disposed on the conductive pad 11. The connection element 19 is disposed on the interconnection conductive structure 126. A semiconductor trace structure 1 is formed.

Referring to FIG. 7Y, a semiconductor device 17 is disposed on the semiconductor trace structure 1. The semiconductor device 17 includes a conductive bump 171. The semiconductor device 17 is surrounded by an underfill 172. The conductive bump 171 171 directly contacts the conductive pad 11. Subsequently, a singulation operation is performed. A semiconductor package structure 2 is formed.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 within 30 within 20 within 10 or within 1 μm of lying along the same plane.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

What is claimed is:

1. A semiconductor trace structure for carrying a heat source, comprising:
    a dielectric structure having an upper surface configured to receive the heat source and a lower surface opposite to the upper surface; and
    a cavity defined by the dielectric structure to accommodate a fluid;
    wherein the cavity includes a first passage portion between the upper surface and the lower surface, a first area of the first passage portion being closer to the heat source than a second area of the first passage portion, the first area being greater than the second area from a top view perspective.

2. The semiconductor trace structure of claim 1, wherein the first passage portion comprises a tapered profile.

3. The semiconductor trace structure of claim 1, wherein the first passage portion comprises a step profile.

4. The semiconductor trace structure of claim 1, wherein the cavity further comprises:
    a first guidance portion in proximity to the upper surface of the dielectric structure; and
    a second guidance portion in proximity to the lower surface of the dielectric structure,
    wherein the first passage portion connects the first guidance portion and the second guidance portion.

5. The semiconductor trace structure of claim 1, further comprising a second passage portion between the cupper surface and the lower surface.

6. The semiconductor trace structure of claim 5, wherein the second passage portion comprises a vertical profile.

7. The semiconductor trace structure of claim 1, further comprising a conductive layer lining on an inner wall of the cavity.

8. The semiconductor trace structure of claim 7, further comprising a conductive trace embedded in the dielectric structure.

9. The semiconductor trace structure of claim 8, wherein the conductive trace is electrically connected to the conductive layer.

10. The semiconductor trace structure of claim 1, further comprising a sealing element disposed on one of the upper surface and the lower surface.

11. The semiconductor trace structure of claim 1, wherein the fluid comprises at least one of methanol, pentane, benzene, ethyl alcohol, or refrigerant.

12. The semiconductor trace structure of claim 1, wherein a first width of the first area is wider than a second width of the second area from a cross sectional perspective.

13. A semiconductor package structure, comprising:
    a dielectric structure having an upper surface and a lower surface opposite to the upper surface;
    a cavity defined by the dielectric structure to accommodate a fluid; and a heat source at the upper surface of the dielectric structure;

wherein the cavity includes a first passage portion having a first principal dimension, from a cross sectional perspective, between the upper surface and the lower surface, and the first passage portion is under a projection of the heat source.

14. The semiconductor package structure of claim 13, wherein the first passage zone tapers from the upper surface toward the lower surface.

15. The semiconductor package structure of claim 13, wherein the first passage portion further has a second principal dimension across the heat source from a top view perspective.

16. The semiconductor package structure of claim 13, further comprising a first guidance portion proximal to the upper surface and a second guidance portion proximal to the lower surface, wherein the first passage portion connects the first guidance portion and the second guidance portion.

17. The semiconductor package structure of claim 16, further comprising a second passage portion parallel to the first passage portion, the second passage portion being under the projection of the heat source.

18. The semiconductor package structure of claim 17, wherein the fluid is configured to flow from the first guidance portion to the second guidance portion through the first passage portion.

19. The semiconductor trace structure of claim 1, wherein the first area is in a rectangular shape, a square shape, an elliptical shape, a circular shape, or an irregular shape.

20. The semiconductor package structure of claim 13, wherein the heat source comprises at least a semiconductor die.

* * * * *